US006523976B1

(12) United States Patent
Turnbull et al.

(10) Patent No.: US 6,523,976 B1
(45) Date of Patent: *Feb. 25, 2003

(54) LED ASSEMBLY

(75) Inventors: Robert R. Turnbull, Holland, MI (US); Robert C. Knapp, Coloma, MI (US); John K. Roberts, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/604,056

(22) Filed: Jun. 26, 2000

Related U.S. Application Data

(63) Continuation of application No. 09/148,375, filed on Sep. 4, 1998, now Pat. No. 6,132,072, which is a continuation of application No. 08/664,055, filed on Jun. 13, 1996, now Pat. No. 5,803,579.

(51) Int. Cl.[7] .................................................. B60Q 1/00
(52) U.S. Cl. ....................... 362/231; 362/497; 362/800; 362/545
(58) Field of Search .............................. 362/230, 231, 362/800, 249, 543, 544, 545, 494, 293, 490, 135, 497; 40/204

(56) References Cited

U.S. PATENT DOCUMENTS

| 3,875,456 A | 4/1975 | Kano et al. |
| 4,211,955 A | 7/1980 | Ray |
| 4,298,869 A | 11/1981 | Okuno |
| 4,377,768 A | 3/1983 | Gallaro et al. |
| 4,450,512 A | 5/1984 | Kristofek |
| 4,580,196 A | 4/1986 | Task |
| 4,646,210 A | 2/1987 | Skogler et al. |
| 4,733,336 A | 3/1988 | Skogler et al. |
| 4,807,096 A | 2/1989 | Skogler et al. |
| 4,849,803 A | * 7/1989 | Yamamoto et al. ......... 362/800 |
| 4,882,565 A | 11/1989 | Gallmeyer |
| 4,929,866 A | 5/1990 | Murata et al. |
| 4,947,291 A | 8/1990 | McDermott |
| 4,992,704 A | 2/1991 | Stinson |

(List continued on next page.)

FOREIGN PATENT DOCUMENTS

| CA | 905475 | * 7/1972 |
| DE | 3916875 | 12/1990 |
| EP | 0625793 | 9/1998 |
| EP | 0689000 | 9/1998 |
| JP | 62 18775 | 1/1987 |
| JP | 62235787 | 10/1987 |

OTHER PUBLICATIONS

R. W. G. Hunt, *Measuring Colour*, reprinted in 1992 by Ellis Horwood Limited, pp. 38–79 and 124–33.
SAE J578, Surface Vehicle Standard—Color Specification, revised Jun. 1995.
David H. Brainard, Colorimetry, XP 002040706, Chap. 26, pp. 26.1–26.53.
English translation of 2087 Elektronic, vol. 44, No. 15, Jul. 25, 1995, p. 134, "LED–Bauelement".
J.L. Schnapf et al., "Spectral Sensitivity of Human Cone Photoreceptors," Nature, vol. 325, Jan. 29, 1987, pp. 439–441.

*Primary Examiner*—Thomas M. Sember
(74) *Attorney, Agent, or Firm*—Price, Heneveld, Cooper, DeWitt & Litton; Brian J. Rees

(57) ABSTRACT

An illuminator assembly, having a plurality of LEDs on a vehicular support member in a manner such that, when all of the LEDs are energized, illumination exhibiting a first perceived hue, e.g., blue-green, and projected from at least one of the LEDs overlaps and mixes with illumination exhibiting a second perceived hue, e.g., amber, which is distinct from said first perceived hue and which is projected from at least one of the remaining LEDs in such a manner that this overlapped and mixed illumination forms a metameric white color and has sufficient intensity and color rendering qualities to be an effective illuminator.

84 Claims, 20 Drawing Sheets

U.S. PATENT DOCUMENTS

| | | | |
|---|---|---|---|
| 5,008,595 A | 4/1991 | Kazar | |
| 5,083,192 A | 1/1992 | Rzeznik et al. | |
| 5,136,483 A | 8/1992 | Schöniger et al. | |
| 5,143,433 A | 9/1992 | Farrell | |
| 5,255,171 A | 10/1993 | Clark | |
| 5,289,082 A * | 2/1994 | Komoto | 362/800 |
| 5,303,037 A | 4/1994 | Taranowski | |
| 5,325,271 A | 6/1994 | Hutchisson | |
| 5,371,659 A | 12/1994 | Pastrick et al. | |
| 5,384,519 A | 1/1995 | Gotoh | |
| 5,477,436 A | 12/1995 | Bertling et al. | |
| 5,497,305 A | 3/1996 | Pastrick et al. | |
| 5,564,819 A * | 10/1996 | Yamaguchi | 362/241 |
| 5,613,751 A * | 3/1997 | Parker et al. | 362/800 |
| 5,699,044 A | 12/1997 | Van Lente et al. | |
| 5,836,676 A * | 11/1998 | Ando et al. | 362/244 |
| 5,865,529 A * | 2/1999 | Yan | 362/327 |
| 5,895,115 A | 4/1999 | Parker et al. | |
| 5,921,652 A | 7/1999 | Parker et al. | |
| 5,944,408 A * | 8/1999 | Tong et al. | 362/252 |
| 6,126,298 A * | 10/2000 | Wu | 362/252 |
| 6,184,629 B1 * | 2/2001 | Won | 362/123 |

\* cited by examiner

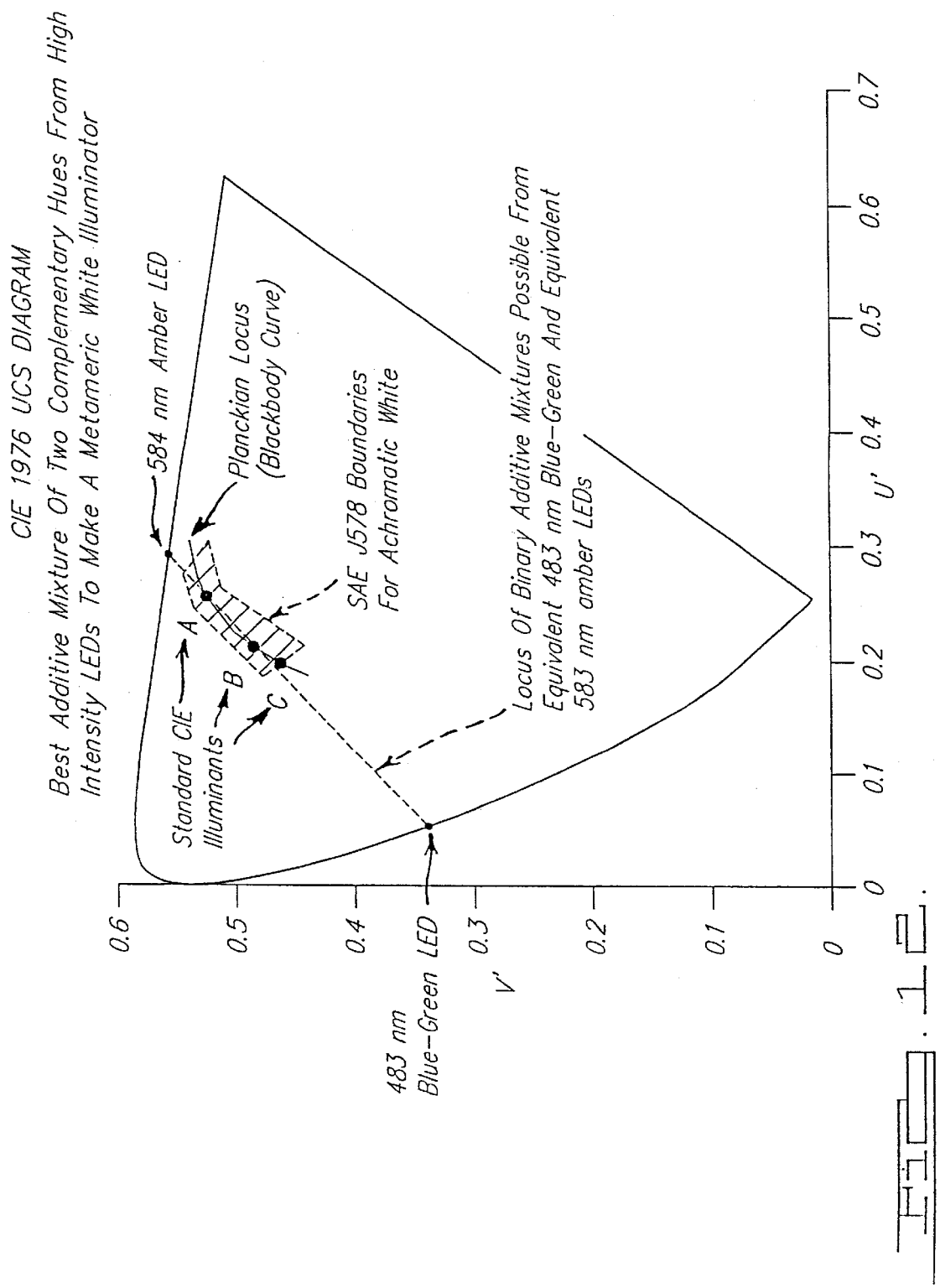

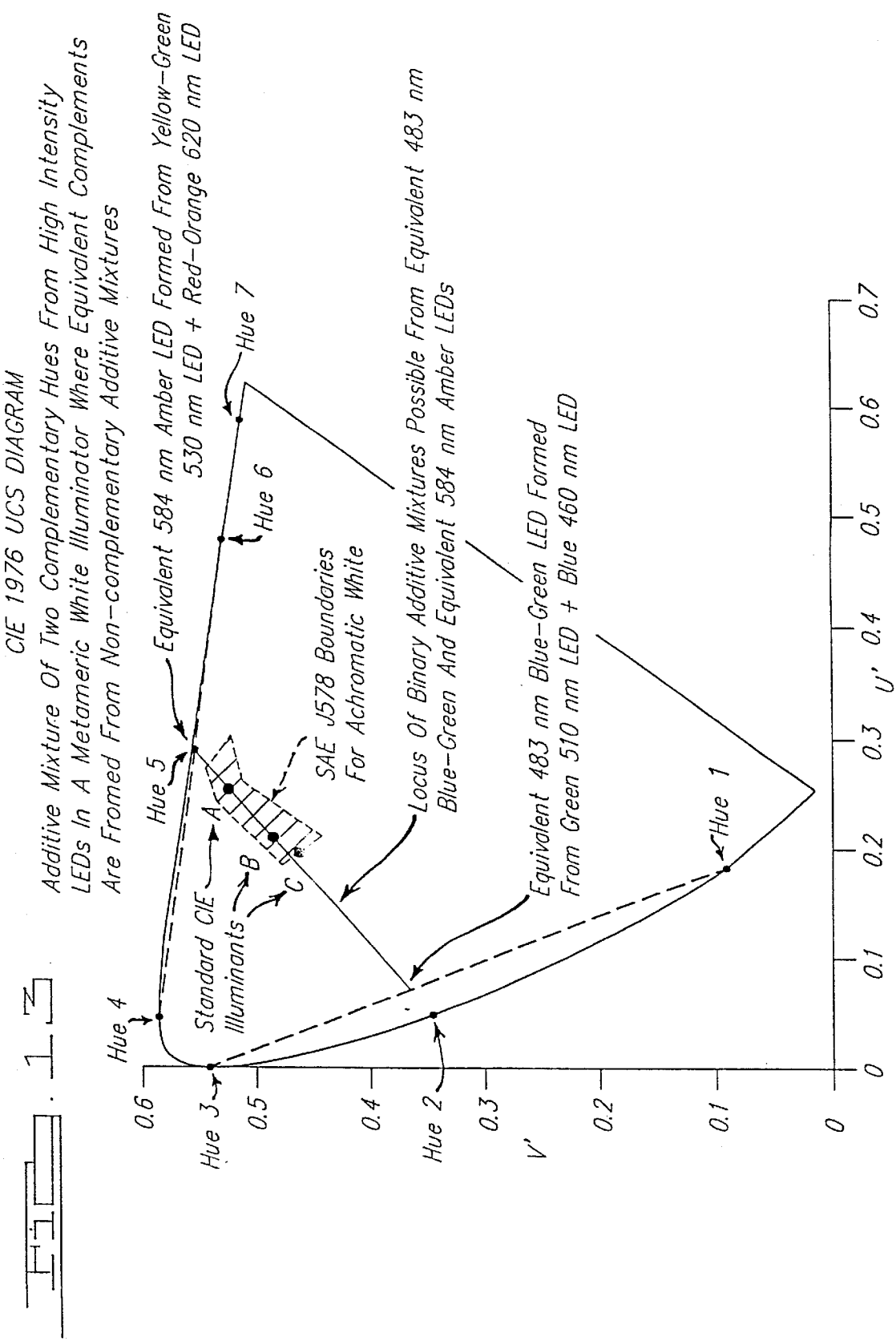

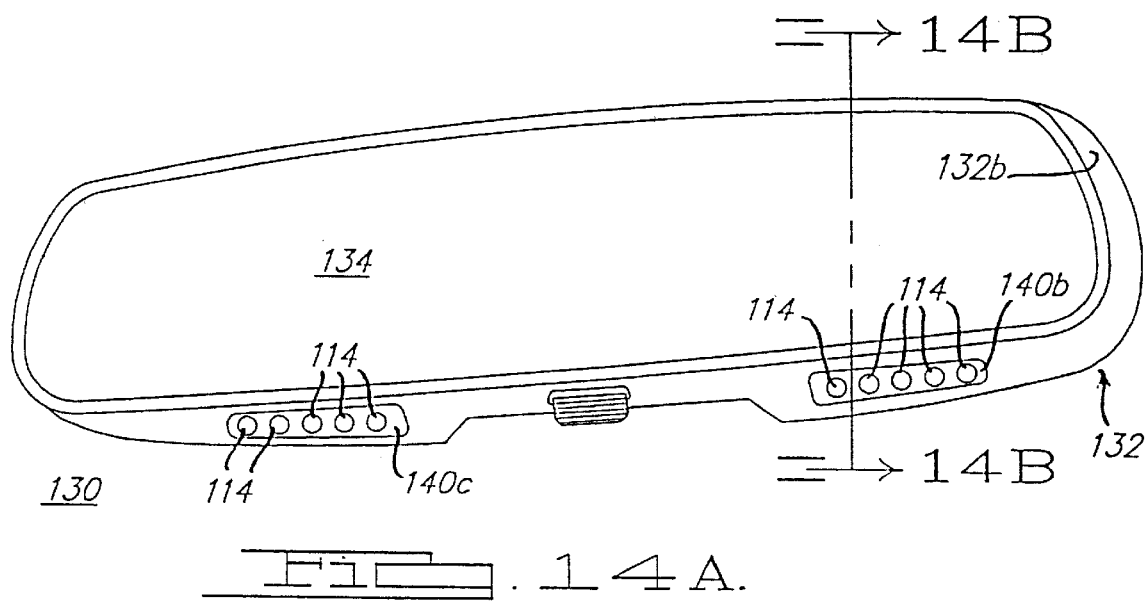
FIG. 14A.
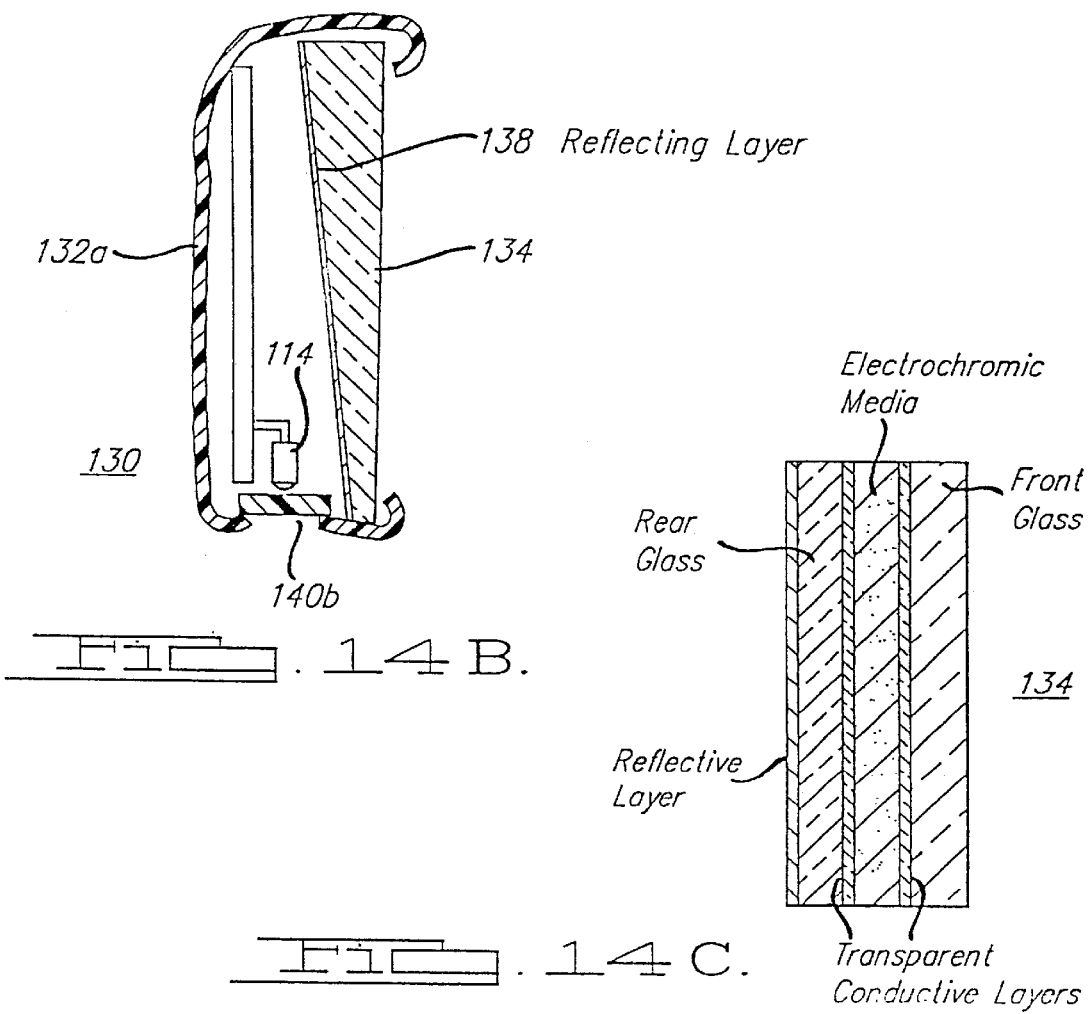
FIG. 14B.
FIG. 14C.

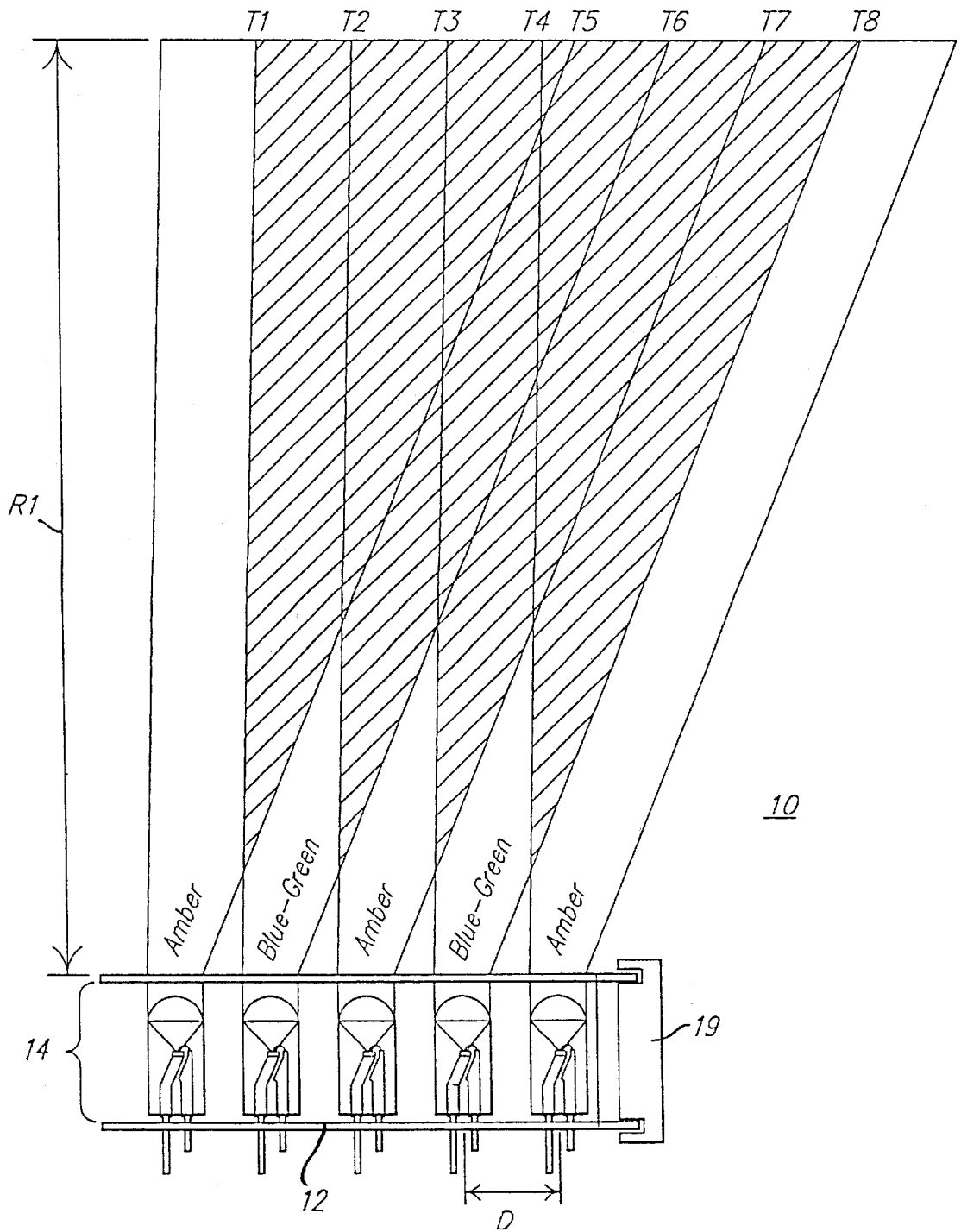
$R1 \geq 20 \times D$ (Far Field)
$R1 = 22''$ For Interior Mirror Maplight
$D = 0.4$ Inches For Interior Mirror Maplight
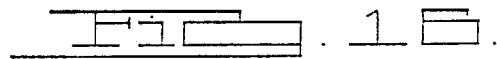

LED ASSEMBLY

CROSS-REFERENCE TO RELATED APPLICATIONS

This application is a continuation of U.S. patent application Ser. No. 09/148,375, entitled ILLUMINATOR ASSEMBLY INCORPORATING LIGHT EMITTING DIODES, filed on Sep. 4, 1998, by Robert R. Turnbull et al., now U.S. Pat. No. 6,132,072, which is a continuation of U.S. patent application Ser. No. 08/664,055, filed on Jun. 13, 1996, now U.S. Pat. No. 5,803,579, the entire disclosures of which are incorporated herein by reference.

BACKGROUND OF THE INVENTION

The present invention relates to an illuminator assembly incorporating light emitting diodes, and more particularly to vehicular, portable, and other specialty white-light illumination systems utilizing light emitting diodes having complementary hues.

Due to limitations in human vision in low light level environments, white-light illuminator systems have long been used to produce artificial illumination and enhance visibility during nighttime or overcast conditions or within interior quarters obscured from the reach of solar illumination. Illuminators are therefore generally designed to mimic or reproduce daytime lighting conditions, to the extent possible, so that illuminated subjects of interest are bright enough to be seen and have sufficient visual qualities such as color and contrast to be readily identifiable.

A diversity of illuminator systems such as stationary lamps in buildings, portable flashlights, and vehicular headlamps and courtesy lights have evolved throughout history and have traditionally produced white light for general, spot, or flood illumination, using a variety of sources such as candles, oil, kerosene, and gas burning elements, incandescent and halogen bulbs, and fluorescent and other arc-discharge lamps. White light is critical in such uses because of its unique ability to properly render colored objects or printed images relative to one another and its similarly unique ability to preserve luminance and color contrast between adjacent objects or printed images having different colors. For instance, a blue photographic image of an ocean panorama will be readily distinguished by an unaided observer from black photographic images of volcanic rocks when the photograph containing these images is illuminated by white light. The two images would be, however, virtually indistinguishable from one another if illuminated with a deeply red colored illuminator. Another example arises from the need to properly identify differently colored regions on conventional aeronautical or automotive maps. On an automotive map, white-light illuminators make it easy to discern the difference between the yellow markings for urban regions and the surrounding white rural areas. A deeply yellow colored illuminator would make this distinction virtually impossible. On an aeronautical chart, white-light illuminators make it possible to discern the difference between the characteristic blue markings for certain types of controlled airspace and the green pattern of underlying terrain, whereas a deeply red colored illuminator would make this distinction virtually impossible.

Furthermore, these issues of color discrimination and contrast go beyond the simple need for accurate identification. It is, for example, a well-known fact that high contrast is critical for avoiding severe operator eye fatigue and discomfort during prolonged visual tasks, whether the subject of study is a book, magazine, newspaper or a map. White-light illuminators provide more universally high contrast and good color discrimination, thereby avoiding these annoying and dangerous physiological side effects.

The extensive evolution and widespread use of white-light illuminators, along with rapidly advancing technology and a phenomenon known as "color constancy," have fostered acceptance of a rather broad range of unsaturated colors as "white." Color constancy refers to the well-known fact that the level and color of slightly unsaturated or near-white illumination over an area can vary moderately without substantially altering the perceived colors of objects in that setting relative to one another. An example of this is the appearance of an outdoor scene to an observer wearing slightly amber or green sunglasses. After a brief moment of adaptation upon donning the sunglasses, an observer becomes unaware that the scene is being passed through a slightly colored filter. Another example is the tacit acceptance of a wide variety of "white" illuminators in residential, commercial, and public illumination. The bluish or cool white from various fluorescent lamps is virtually universal in office buildings, whereas the yellowish or warm white of incandescent lamps is dominant in residential lighting. The brilliant bluish-white of mercury vapor and metal halide lamps is commonplace in factory assembly lines, whereas the bronze-white emission of the high-pressure sodium lamp dominates highway overhead lighting in urban areas. Despite the discernible tint of each of these sources which would be evident if they were compared side by side, they are generally accepted as white illuminators because their emissions are close enough to an unsaturated white to substantially preserve relative color constancy in the objects they illuminate. In other words, they render objects in a manner that is relatively faithful to their apparent "true" colors under conditions of natural illumination.

There are limits to the adaptability of human color vision, however, and color constancy does not hold if highly chromatic illuminators are used or if the white illumination observed in a setting is altered by a strongly colored filter. A good example of this limitation can be experienced by peering through a deeply colored pair of novelty sunglasses. If these glasses are red, for instance, then it will be nearly impossible to discern a line of red ink on white paper, even though the line would stand out quite plainly in normal room illumination if the glasses are removed. Another illustration of this effect is the low-pressure sodium lamp used for certain outdoor urban illumination tasks. This type of lamp emits a highly saturated yellow light which makes detection and or identification of certain objects or printed images very difficult if not impossible, and, consequently their commercial use has been very limited. As will be discussed later, a similar problem arises from prior-art attempts to use high intensity red or amber light emitting diodes (LEDs) as illuminators since they, like the low-pressure sodium lamp, emit narrow-band radiation without regard for rendering quality.

In order to improve the effectiveness of white-light illumination systems, various support structures are typically employed to contain the assembly and provide energy or fuel to the incorporated light source therein. Furthermore, these systems typically incorporate an assortment of optical components to direct, project, intensify, filter, or diffuse the light they produce. A modern vehicle headlamp assembly, for instance, commonly includes sealed electrical connectors, sophisticated injection-molded lenses, and molded metal-coated reflectors which work in concert to collimate and distribute white light from an incandescent, halogen, or arc-discharge source. A backlight illuminator for an instrument panel in a vehicle or control booth typically contains elaborate light pipes or guides, light diffusers, and extractors.

Of course, traditional white-light sources, which generate light directly by fuel combustion, are no longer suitable for most vehicular, watercraft, aircraft, and portable and certain other applications where an open flame is unsafe or undesirable. These therefore have been almost universally superseded by electrically powered, white-light sources. Furthermore, many modern electric light sources are relatively inefficient, e.g., conventional tungsten incandescent lamps, or require high voltages to operate, e.g., fluorescent and gas discharge lamps, and therefore are not optimal for vehicular, portable, and other unique illuminators used where only limited power is available, only low voltage is available, or where high voltage is unacceptable for safety reasons.

Because no viable alternatives have been available, however, illuminators for these overland vehicles, watercraft, aircraft, and the other fields mentioned have used low-voltage incandescent white-light illuminators for quite some time to assist their operators, occupants, or other observers in low light level situations. In automobiles, trucks, vans and the like, white-light illuminators are used as dome lights, map lights, vanity mirror lights, courtesy lights, headlamps, back-up lights and illuminators for the trunk and engine compartments and license plate. In such vehicles, white-light illuminators are also used to backlight translucent screen-printed indicia such as those found in an instrument cluster panel, door panel, or heater and ventilation control panel. Similar uses of white-light incandescent illuminators are found on motorcycles, bicycles, electric vehicles, and other overland craft. In aircraft, white-light illuminators are used in the passenger compartment as reading lamps to illuminate the floor and exits during boarding, disembarking, and emergencies, to illuminate portions of the cockpit, and to backlight or edge-light circuit breaker panels and control panels. In watercraft such as ships, boats, and submarines, white-light illuminators are used to illuminate the bridge, the decks, cabins, and engineering spaces. In portable and specialty lighting applications, low-voltage white-light illuminators are used as hand-held battery-powered flashlights, as helmet-mounted or head-mounted lamps for mountaineering or mining, as automatically-activated emergency lighting for commercial buildings, as task lighting in volatile environments, and as illuminators in a wide variety of other situations where extreme reliability, low voltage, efficiency, and compactness are important.

These aforementioned white-light illuminators rely almost exclusively upon incandescent lamps as light sources because incandescent bulbs are inexpensive to produce in a wide variety of forms and, more importantly, they produce copious quantities of white light. Despite this, incandescent lamps possess a number of shortcomings, which must be taken into account when designing an illuminator assembly.

Incandescent lamps are fragile and have a short life even in stable environments, and consequently must be replaced frequently at great inconvenience, hazard, and/or expense. This need for replacement has complicated designs for all manners of illuminators, but especially for vehicles. For example, U.S. Pat. No. 4,087,096 issued to Skogler et al. discloses a carrier module for supporting lamps for illuminating a portion of a vehicle interior. The carrier module has a rigid body and a pair of mounting projections for removably mounting the carrier module in a rearview mirror. The design even has an opening specifically designed to allow insertion of a tool for releasing the module from the rearview mirror. This carrier module is an excellent example of the Herculean design efforts taken by mirror manufactures to ensure incandescent lamps can be easily removed and replaced by a vehicle owner.

In addition to their inherently short life, incandescent lamps are very susceptible to damage from mechanical shock and vibration. Automobiles experience severe shocks and significant vibration during driving conditions which can cause damage to incandescent lamps, particularly the filaments from which their light emissions originate. This is an especially severe problem for lamps mounted on or near the engine hood, trunk lid, passenger doors, exterior mirrors, and rear hatch or gate, all of which periodically generate tremendous shocks upon closing. Aircraft and portable illuminators experience similar environments, and therefore, another source of white light would be highly beneficial to decrease the time and cost associated with replacing lamps therein on a regular interval.

Incandescent lamps can also be easily destroyed by exposure to liquid moisture due to the thermo-mechanical stress associated with contact between the hot glass bulb wall and the room-temperature fluid. Incandescent lamps are also easily damaged by flying stones and the like. Thus, it is very difficult to incorporate an incandescent light on an exterior mirror without going to extreme measures to protect the light bulb from shock, vibration, moisture and flying objects while still allowing for removal of the light fixture when it either burns out or is otherwise permanently damaged.

Incandescent lights also exhibit certain electrical characteristics which make them inherently difficult to incorporate in vehicles, such as an automobile. For instance, when an incandescent light source is first energized by a voltage source, there is an initial surge of current which flows into the filament. This inrush current, which is typically 12 to 20 times the normal operating current, limits the lifetime of the lamp thus further amplifying the need for an illuminator structure which allows for frequent replacement. Inrush current also necessitates unusual consideration when designing supporting electrical circuits which contain them. Fuses, relays, mechanical or electronic switches, wire harnesses, and connectors electrically connected to such lamps must be capable of repeatedly carrying this extreme transient.

In addition, the voltage-current (V-I) characteristic of incandescent lamps is notoriously non-linear, as are each of the relationships between light output and voltage, current, or power. The luminous intensity, color temperature, and service life of incandescent lamps varies exponentially as a function applied current or voltage. This sensitivity to power source variation makes electronic control of incandescent lamps a particularly difficult problem. They are further susceptible to significant reliability and field service life degradation when subjected continuously to DC electrical power, pulse-width modulated DC power, simple on/off switching of any sort, or any over-voltage conditions, however minor. Incandescent lamps also possess significant inductance which, when combined with their relatively high current load, complicates electronic switching and control greatly due to inductive resonant voltage transients. A typical square wave, DC pulse modulation circuit for a 0.5 amp, 12.8 volt incandescent lamp might produce brief transients as high as 30 volts, for instance, depending on the switching time, the lamp involved, and the inductance, capacitance, and resistance of the remainder of the circuit.

Incandescent lamps also suffer from poor efficiency in converting electrical power into radiated visible white light.

Most of the electrical energy they consume is wasted in the form of heat energy while less than 7 percent of the energy they consume is typically radiated as visible light. This has severe negative consequences for vehicular, aerospace, watercraft, and portable illuminator applications where the amount of power available for lighting systems is limited. In these applications, electrical power is provided by batteries which are periodically recharged by a generator on a ship or aircraft, an alternator in an automobile, by solar cells in the case of some remote or aerospace applications, or are otherwise periodically replaced or recharged with an AC/DC adapter such as in the case of a flashlight. Because these mechanisms for restoring battery charge are inherently bulky, heavy, and/or expensive, it is severely detrimental for an illuminator to possess poor power-conversion efficiency in generating visible light. An acute example of the importance in illuminator efficiency is the electric vehicle. For electric bicycles, mopeds, motorcycles, automobiles, golf carts, or passenger or cargo transfer carts, white-light illuminators in the form of electric headlamps, backup lamps, etc. consume an unusually large portion of the vehicle's limited power budget; hence they would benefit greatest from high-efficiency white-light illuminators. If a more efficient white-light source was available, much less power would be required to energize the illuminator and more power would be available for other systems. Alternatively, the power savings from an improved illuminator would allow for improved power supplies and energy storage or energy replacement mechanisms.

Another result of poor efficiency associated with incandescent lamps is that they generate large amounts of heat for an equivalent amount of generated light as compared to other sources. This results in very high bulb-wall temperatures typically in excess of 250 degrees C. and large heat accumulations which must be dissipated properly by radiation, convection, or conduction to prevent damage or destruction to the illuminator support members, enclosure, optics or to other nearby vehicle components. This high heat signature of common incandescent light sources in illuminators has a particularly notable impact on the specialized reflector and lens designs and materials used to collimate and direct the light. Design efforts to dissipate the heat while retaining optical effectiveness further add requirements for space and weight to the illuminator assembly, a severe disadvantage for vehicular, watercraft, aircraft, and portable applications which are inherently sensitive to weight and space requirements.

Portable illuminators such as hand-held flashlights and head-mounted lamps experience similar problems stemming from incandescent white-light sources and would derive the same benefits from an improved system.

Physical mechanisms for generating white-light radiation other than incandescence and pyroluminescence are available, including various gas discharges, electroluminescence, photoluminescence, cathodoluminescence, chemiluminescence and thermoluminescence. The output of sources using these phenomena can be tailored to meet the requirements of specific systems; however, they have had limited use in vehicular, watercraft, aircraft or portable illuminators because of a combination of low intensity, poor efficiency, high voltage requirements, limited environmental resilience, high weight, complexity, high cost, poor reliability, or short service life.

More recently, great interest has been shown in the use of electroluminescent semi-conductor devices such as light emitting diodes (LEDs) as the light source for illuminator systems. Due to their strong coloration and relatively low luminous output as compared to incandescent lamps, early generations of LEDs found most of their utility as display devices, e.g., on/off and matrix-addressed indicators, etc. These uses still dominate the LED market today, however, recent advances in LED materials, design, and manufacturing have resulted in significant increases in LED luminous efficacy and, in their most recent commercial forms, exhibit a higher luminous efficacy than incandescent lights. But, even the latest LEDs emit highly saturated, narrow-bandwidth, distinctively non-white light of various hues. As discussed above, white light in one of its various manifestations is essential for most illuminator systems.

Despite the inherent colorfulness of LEDs, they offer many potential advantages as compared to other conventional low-voltage light sources for vehicles, watercraft, aircraft, and portable illuminators. LEDs are highly shock resistant and therefore provide significant advantages over incandescent and fluorescent bulbs which can shatter when subjected to mechanical or thermal shock. LEDs possess operating lifetimes from 200,000 hours to 1,000,000 hours, as compared to the typical 1,000 to 2,000 hours for incandescent lamps or 5,000–10,000 hours for fluorescent lamps.

It has been known that the narrow-band spectral emissions of several saturated light sources having different apparent colors can be combined to produce an additive color mixture having an apparent color which is different than that of any of its constituents. The basics of additive color are evident, for instance, in the observation that white sunlight decomposes into its constituent spectra when refracted by a prism or dispersions of water droplets such as occurs in a typical rainbow. The visible white light of the sun can therefore be considered an additive color mixture of all of the hues associated with its radiation in the visible spectrum having wavelengths from 380 to 780 nanometers.

An important and common example of additive color mixtures is the technique used in most color display screens possessing a cathode ray tube (CRT) or a liquid crystal display (LCD) element. These displays consist of addressable arrays of pixels, each of which contains subpixels having the hues red, green, and blue which can be energized alone or in combinations. In the case of the CRT, each sub-pixel is a dot of inorganic phosphor which can be excited via cathodoluminescence by a steered electron beam. In the case of the LCD, each sub-pixel is a dot of colored dye in registry with a switchable liquid crystal shutter, the combination of which acts as a reconfigurable filter for a backlight. The result in either of these cases is that a brightly colored red sub-pixel can be energized simultaneously with an adjacent bright green pixel in unresolvable proximity to the red in order to form the perceived color yellow. A similar combination of the green sub-pixel and a blue one will form the perceived color cyan. A similar combination of the red sub-pixel and a blue one will form the perceived color magenta. Energizing all three of the red, green, and blue sub-pixels within a pixel concurrently will yield the perceived color white, if the brightness of each sub-pixel is proportioned properly. The relative proportions of the brightness of each of these differently colored sub-pixels can further be actively manipulated in a wide variety of combinations resulting in a continuum of perceived colors nearly replicating all of the colors available within human color vision, including white. Unfortunately, while these types of displays may exhibit appreciable surface brightness, they are extremely bulky, expensive and complicated and do not project suitable amounts of illumination at a distance to be of use as effective illuminators. For example, even the brightest and largest television screen casts only a dim glow across a darkened room. The illumination level associated with this dim glow is barely sufficient for reading a newspaper and is completely inadequate to identify objects or colors in a detailed photograph. However, the capability of such an R-G-B display system to reproduce appreciably all of the colors available within human color vision is an excellent example of the important phenomenon known as metamerism, which will be discussed in greater detail hereinafter.

LEDs are available in various hues and it is known that the output of red, blue, and green LEDs can be combined in a fashion similar to that used for a CRT in the proper proportions to produce a variety of perceived colors, including the perceived color white. For example, U.S. Pat. No. 5,136,483 issued to Karl-Heinz Schoniger et al. discloses a light emitting device having twelve LEDs arranged to form a headlamp or signaling lamp. Schoniger et al. also discloses that to produce white light, red, green, and blue LEDs need to be used simultaneously. However, such a system is rather complicated, and Schoniger et al. does not mention the inherent susceptibility of an R-G-B system to unacceptable variation due to significant variations in luminous output produced from one LED to another of the same type. Such LED variations cause errors in the relative proportions of the actual color mixture produced versus that desired and, coupled with high complexity and cost, render the system undesirable for most practical uses.

Consequently, it is desirable to provide a highly reliable, low-voltage, long-lived, LED illuminator capable of producing white light with sufficient luminous intensity to illuminate subjects of interest well enough to be seen and to have sufficient apparent color and contrast so as to be readily identifiable.

OBJECTS OF THE INVENTION

Accordingly, a primary object of the present invention is to provide an illuminator assembly projecting effective white illumination and having a plurality of LEDs of two types whose visible emissions when energized have hues which are complementary to one another and combine to form a metameric white illumination.

Another object of the present invention is to provide a high efficiency illuminator assembly, for use in limited power applications, projecting effective white illumination and having a plurality of LEDs of two types whose visible emissions when energized have hues which are complementary to one another and additively combine to form illumination with a metameric white color.

Yet another object of the present invention is to provide an automotive rearview mirror incorporating an illuminator assembly projecting effective white illumination and having a plurality of LEDs of two types whose visible emissions when energized have hues which are complementary to one another and whose beams overlap and additively mix to form a metameric white illumination.

Yet another object of the present invention is to provide an illuminator assembly projecting an effective photopic white illumination within a central zone and mesopic illumination in a surrounding zone bounded from the first by a photopic illuminance threshold and having a plurality of LEDs of two groups or types whose emissions when energized form an additive binary complementary or equivalent binary complementary color mixture.

Still another object of the present invention is to provide a circuit operable to power an illuminator assembly of the present invention.

SUMMARY OF THE INVENTION

The above and other objects, which will become apparent from the specification as a whole, including the drawings, are accomplished in accordance with the present invention by disposing a plurality of light emitting diodes on a support member to provide a lightweight, robust illuminator.

Briefly, according to a preferred embodiment of the invention, an illuminator assembly is provided by placing on a support member in a housing a plurality of LEDs of two types whose visible emissions when energized have hues which are complementary to one another, e.g., blue-green and amber, and are projected such that their overlapped and mixed beams form a metameric white illumination having sufficient intensity and color rendering qualities to be effective.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings, where like numerals represent like components, in which:

FIG. 12 is a CIE 1976 UCS diagram showing the location of the Planckian Locus, the locations of Standard Illuminants A, B, and C, the location of the translated SAE J578 boundaries for achromatic white light, and the locus of binary additive mixtures from amber 584 nm and blue-green 483 nm LEDs which is substantially coaxial with the Planckian Locus;

FIG. 13 is a CIE 1976 UCS diagram showing the locations of Standard Illuminants A, B, and C, the location of the translated SAE J578 boundaries for achromatic white light, and the locus of binary additive mixtures from equivalent 584 nm amber and equivalent 483 nm blue-green LEDs which is substantially coaxial with the Planckian Locus;

FIGS. 14a is a perspective view of an automotive interior rearview mirror incorporating the illuminator assembly of the present invention, and FIGS. 14b and 14c are cross-sectional views of exemplary mirror elements for insertion into the rearview mirror;

FIG. 16 is an illustrative illumination pattern for an illuminator assembly according to the present invention;

DETAILED DESCRIPTION

The present invention generally relates to an improved illuminator and more specifically to a white-light LED illuminator for use in limited power applications such as vehicles, portable lamps, and specialty lighting. By vehicles, we mean over-land vehicles, watercraft, aircraft and manned spacecraft, including but not limited to automobiles, trucks, vans, buses, recreational vehicles (RVs), bicycles, motorcycles and mopeds, motorized carts, electric cars, electric carts, electric bicycles, ships, boats, hovercraft, submarines, airplanes, helicopters, space stations, shuttlecraft and the like. By portable lamps, we mean camping lanterns, head or helmet-mounted lamps such as for mining, mountaineering, and spelunking, hand-held flashlights and the like. By specialty lighting we mean emergency lighting activated during power failures, fires or smoke accumulations in buildings, microscope stage illuminators, billboard front-lighting, backlighting for signs, etc.

The present invention provides a highly reliable, low-voltage, long-lived, LED illuminator for vehicles, portable lighting, and specialty lighting capable of producing white light with sufficient luminous intensity to illuminate subjects of interest well enough to be seen and to have sufficient apparent color and contrast so as to be readily identifiable. The LEDs of the present invention exhibit extremely predictable electronic properties and are well suited for use with DC power sources, pulse-width modulated DC power sources, and electronic control systems. LEDs do not suffer appreciable reliability or field-service life degradation when mechanically or electronically switched on and off for millions of cycles. The luminous intensity and illuminance from LEDs closely approximates a linear response function with respect to applied electrical current over a broad range of conditions, making control of their intensity a relatively simple matter. Finally, recent generations of AlInGaP, AlGaAs, and GaN LEDs draw less electrical power per lumen or candela of visible light produced than incandescent lamps, resulting in more cost-effective, compact, and lightweight illuminator wiring harnesses, fuses, connectors, batteries, generators, alternators, switches, electronic controls, and optics. A number of examples have previously been mentioned and are incorporated within the scope of the present invention, although it should be recognized that the present invention has obvious other applications beyond the specific ones mentioned which do not deviate appreciably from the teachings herein and therefore are included in the scope of this invention.

Figure 1:
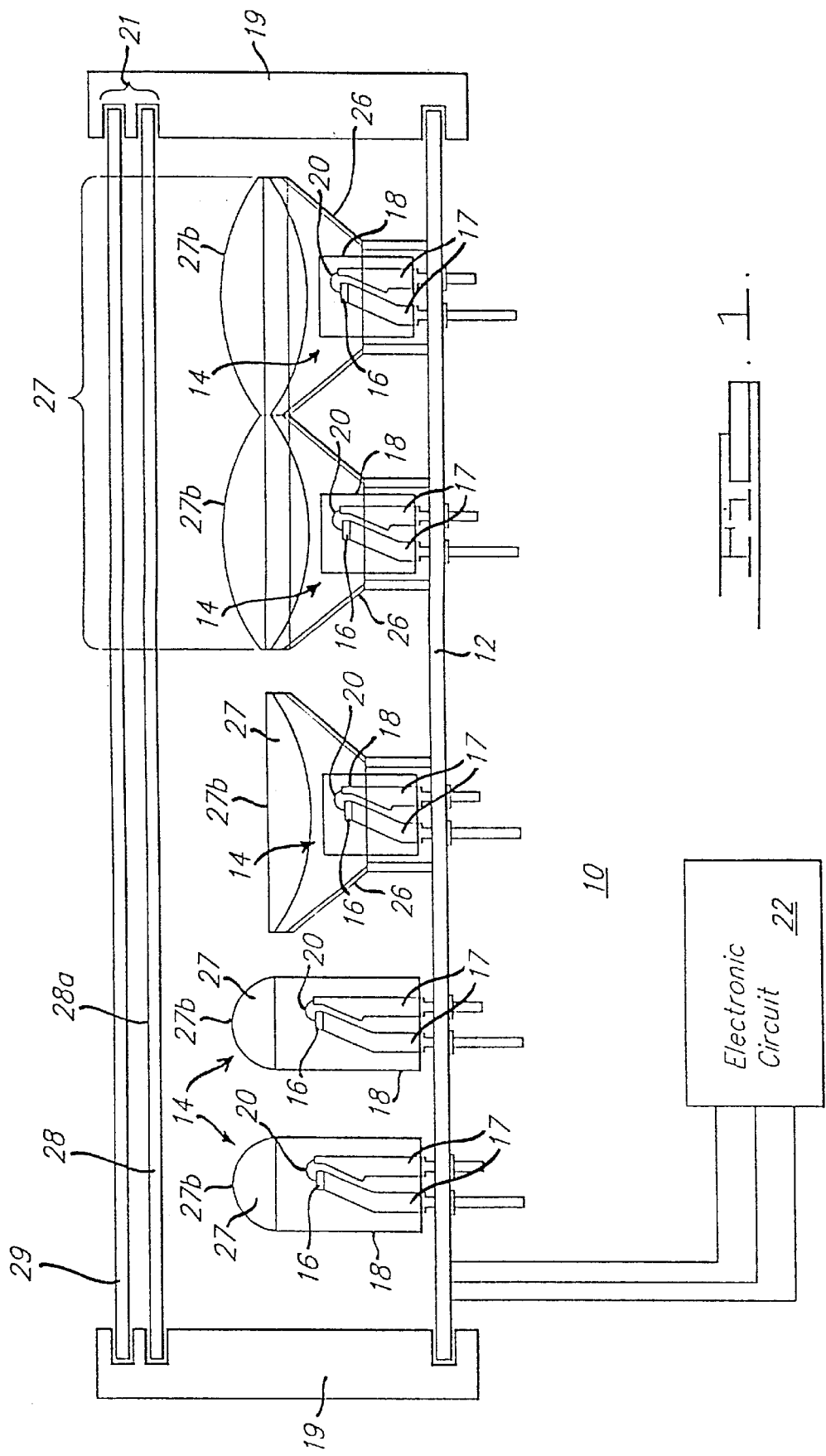
FIG. 1 is a cross-sectional view of an illuminator assembly according to the present invention incorporating conventional discrete LEDs.
Figure 2:
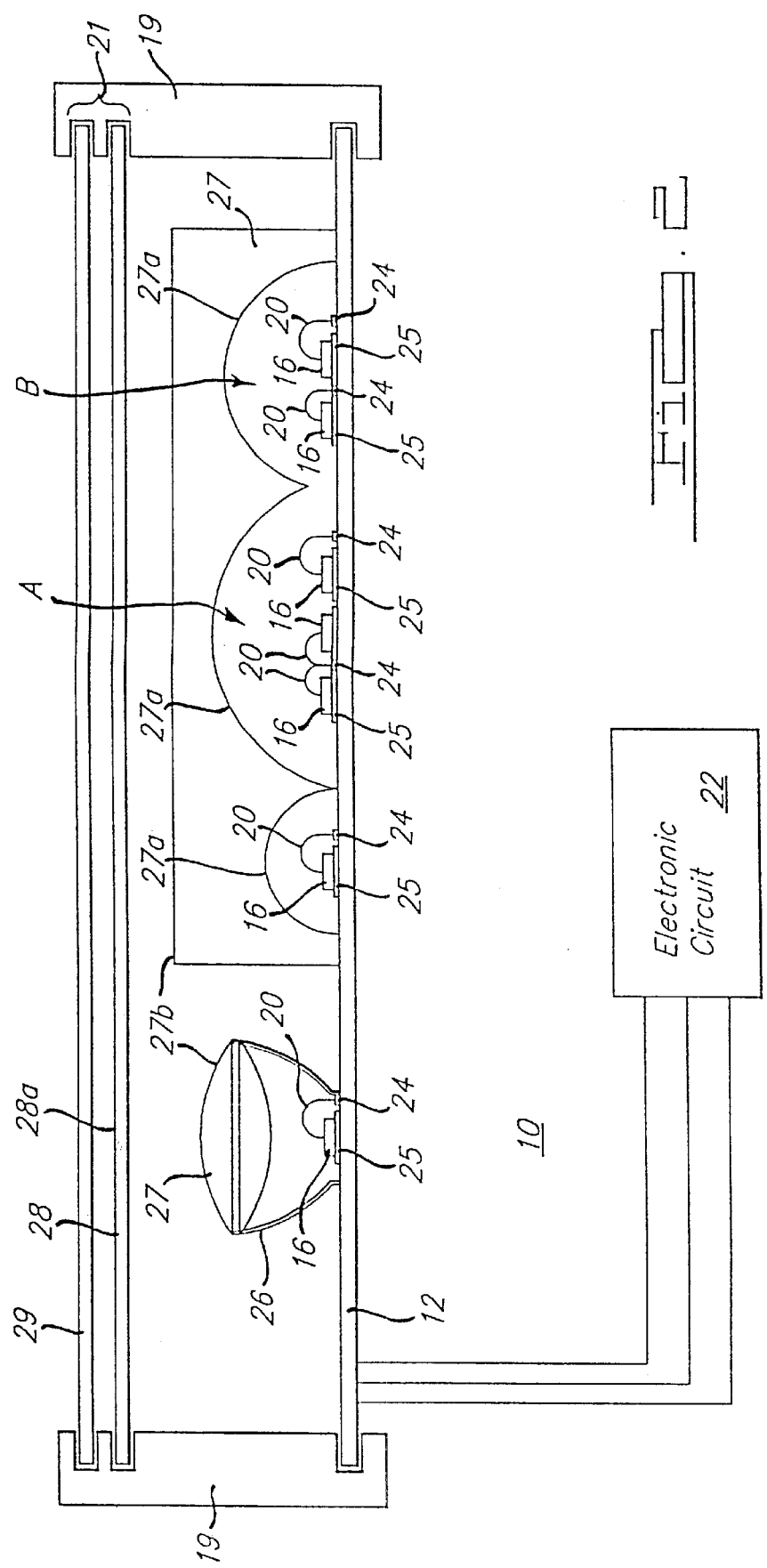
FIG. 2 is a cross-sectional view of an illuminator assembly according to the present invention incorporating a plurality of LED chips in a chip-on-board configuration.

FIGS. 1 and 2 show two embodiments of the present invention using LEDs of two substantially different configurations, FIG. 1 shows an embodiment incorporating conventional discrete LEDs, and FIG. 2 shows an embodiment incorporating individual LED chips.

Conventional discrete LED components include such LED devices such as T 1, T 1¾, T 5, surface mount (SMD), axial-leaded "polyleds," and high power packages such as the SuperNova, Pirahna, or Brewster lamps, all of which are available with a variety of options known to those skilled in the art such as color, size, beam width, etc. Appropriate conventional discrete LEDs may be obtained from manufacturers such as Hewlett Packard, Inc., Optoelectronics Division, located in San Jose, Calif., Stanley Electric Company, LTD located in Tokyo, Japan, Nichia Chemical Industries, LTD located in Anan-shi, Tokushima-ken, Japan and many others.

Conventional discrete LEDs 14 are the dominant form of LEDs in general use because of their generic shapes and ease of processing in standard printed circuit board assembly operations.

Referring to FIG. 1, illuminator 10 is shown including a support member 12 which supports, delivers electrical power to, and maintains a spatial relationship between a plurality of conventional discrete LEDs 14. The structure of support member 12 will vary depending on the specific design of the LEDs 14 and of the illuminator 10, and may be a conventional printed circuit board or optionally may be a portion of housing 19 into which the illuminator assembly 10 is being incorporated. Support member 12 may be shaped such that the emission of all of the LEDs is aligned or otherwise focused on a common spot at some predetermined distance away from the illuminator 10. A conventional discrete LED 14 generally consists of a pre-assembled or packaged "lamp" each of which normally includes a metal lead frame 17 or other substrate for electrical and mechanical connection and internal mechanical support, a semiconductor LED chip or "die" 16, a conductive adhesive or "die attach" (not shown) for electrically and mechanically attaching one electrode of the chip 16 to the lead frame 17 or other substrate, a fine wire conductor 20 for electrically connecting the other electrode of the chip 16 to an area of the lead frame 17 or other substrate which is electrically isolated from the first electrode and die attach by the chip 16 itself. Optionally, a miniature reflector cup (not shown) may also be located adjacent to the chip 16 to further improve light extraction from the device. Finally, a clear, tinted, or slightly diffused polymer matrix enclosure 18 is used to suspend, encapsulate, and protect the chip 16, lead frame 17, optional reflector cup (not shown) and wire conductor 20 and to provide certain desirable optical characteristics.

In conventional discrete LEDs 14, the polymer matrix enclosure 18 typically comprises an optically clear epoxy or any number of materials capable of protecting the LED chip 16 and an upper portion of lead frame 17 from environmental contaminants such as moisture. As shown in FIG. 1, polymer matrix enclosure 18 can further be made integral with lens 27 which will be discussed in greater detail hereinbelow. The upper portion of lead frame 17 is connected to the LED semiconductor chip 16 and a lower portion of lead frame 17 extends out one end of the enclosure 18 to attach to support member 12 and provide electrical connection to an electronic control circuit 22 through wires 23. Circuit 22 is operable to energize, control, and protect the LEDs 14, and manipulate and manage the illumination they produce. Many variations of electronic control circuit 22 will be known to those skilled in the art and will vary depending on the application for illuminator 10. For example, electronic control circuit 22 for a flashlight may simply be an ON-OFF switch, a battery and a resistor in series with the LEDs 14 and support member 12. However, for an automotive rearview mirror assembly, described in detail hereinbelow, circuit 22 will be slightly more complex.

In most conventional discrete LED designs, enclosure 18 also acts as an integral optical element such as a lens 27, deviator 28, or diffuser 29, however separate or secondary optical elements 21 are preferably incorporated in illuminator 10 to improve illuminator performance or appearance. Furthermore, more than one individual LED chip 16 of the same color or of different colors may be incorporated within a single polymer matrix enclosure 18 such that the spacing between conventional discrete LEDs 14 is greater than the spacing between individual chips 16.

A second configuration of LEDs is the individual LED chip, consisting solely of a semiconductor LED chip (without a pre-attached lead frame, encapsulating media, conducting wire, etc.). These are generally shipped in vials or adhered to a membrane called "sticky back" and are mounted in an intermediate manufacturing step directly onto a printed circuit board, ceramic substrate, or other structure to support the individual LED chip and provide electrical connections to it. When a plurality of LEDs is so mounted, the result is a "chip-on-board" LED array which in its entirety can then be incorporated into other assemblies as a subcomponent. Individual LED chips suitable for the present invention are available from Hewlett Packard, Showa Denko, Stanley, and Cree Research, to name just a few. Referring to FIG. 2, if chip-on-board LED designs are utilized, then illuminator 10 has a support member 12 which may be a printed circuit board, ceramic substrate, housing or other structure capable of supporting the individual LED chips 16 while simultaneously providing electrical connection for powering the chips 16. In this configuration, individual LED chips 16 are placed on support member 12, thereby eliminating the bulky pre-packaged polymer matrix enclosure 18, and lead frame 17 of the conventional discrete type of LED 14 in FIG. 1. A more integrated and optimized system is therefore possible by virtue of the flexibility to place individual LED chips 16 within very close proximity to one another on the support member 12 and within very close proximity to reflector 26, lens 27, and/or secondary optical elements 21 used to enhance the light emissions of LED chip 16. In this manner, one or more LED chips 16 can be placed at or very near to the focus of a single lens 27 or lenslet 27a (as shown in areas A and B), improving the alignment and uniformity of the resultant mixed beam projected therefrom. Individual LED chips 16 are very small (on the order of 0.008 inches×0.008 inches×0.008 inches) and can be placed very closely to one another by precision equipment, e.g., pick-and-place machines. Such close pitch spacing is not possible with the conventional discrete LEDs 14 of FIG. 1 because of their relatively large size and larger tolerances associated with their manufacture and assembly. Furthermore, the ability to tightly pack the chips 16 allows extreme design flexibility, improving the aesthetic appeal of illuminator 10.

For chip-on-board designs, the individual LED chips 16 are electrically connected to conductive pad 24 by a fine conductive wire 20 and attached to conductive pad 25 by an electrically conductive die attach adhesive (not shown). The chips 16 and conductive pads 24 and 25 are mounted on, and held in a spaced-apart relationship from one another, by support member 12. LED chips 16 are electrically connected to the support member 12, and to electronic circuit 22, through pads 24 and 25, support member 12 and wires 23.

Referring to Areas A and B, the number, spacing, color, and pattern of individual LED chips 16 under each lenslet 27a can vary from system to system. One or more chips 16 of the same color or different colors chosen according to the teachings of this invention may be placed under a single lenslet 27a such that the spacing between groups of LED chips is greater than the spacing between individual chips. For instance, in Area A, two of the three individual LED chips 16 shown may be a type that emits amber light when energized and the third may be of a type which emits blue-green light when energized. Alternatively, two may be of the blue-green variety and one may be of the amber variety. Also, it is possible for all of the LEDs in Area A to be of one color, e.g. amber, if another nearby group in the plurality of the illuminator such as that shown in Area B of FIG. 2 contains an appropriate number of complementary LEDs, e.g two of the blue-green variety.

A reflector 26 may optionally be used with the above-described conventional discrete LED designs as shown in FIG. 1 or with LED array chip-on-board designs shown in FIG. 2. The reflector 26, if used, is normally a conical, parabolic, or elliptical reflector and typically is made of metal or metal-coated molded plastic. The purpose of the reflector 26 is to collect or assist in the collection of light emitted by the LED chip 16 and project it toward the area to be illuminated in a narrower and more intense beam than otherwise would occur. For chip-on-board LED array designs, reflector 26 is commonly a planar reflector made integral with conductive pad 25 by selective plating of a reflective metal (such as tin solder) and is oriented radially around the LED chip 16. In this case, of course then the combined reflector/conductive pad serves the previously described functions of both the reflector 26 and the conductive pad 25. Suitable reflectors 26 are well known to those skilled in the art and may be obtained from a wide variety of optical molding and coating companies such Reed Precision Microstructures of Santa Rosa, Calif. More is than one reflector 26 to be used for conventional LEDs 14 or LED chips 16 can be combined to make a reflector array whose constituent elements are oriented in substantial registry with the conventional LEDs 14 or LED chips 16.

As shown in FIG. 1 and FIG. 2, lens 27 is normally a magnifier/collimator which serves to collect light emitted by each conventional LED 14 or LED chip 16 and reflected by optional reflector 26 and project it in a narrower and more intense beam than otherwise would occur. As shown in FIG. 1 for an illuminator 10 using conventional LEDs 14, lens 27 is commonly made integral with polymer matrix enclosure 18, or otherwise may be made separately from polymer matrix enclosure 18. Lens 27 may also be made as an integral array of lenslets 27a which are then substantially registered about the centers of individual conventional discrete LEDs 14.

As shown in FIG. 2 for an illuminator 10 using individual LED chips 16 in a chip-on-board configuration, more than one lenslet 27a can be combined in an array to make lens 27 whose constituent elements are lenslets 27a oriented in substantial registry with the LED chips 16, reflectors 26, and pads 24 and 25. In FIG. 2, lenslets 27a are shown as Total Internal Reflection (TIR) collimating lenses whose concave surfaces (facing the individual LED chips 16) consist of radial microprism structures similar to those on a Fresnel lens. However, it should be understood that Plano-convex, bi-convex, aspheric or their Fresnel, total-internal-reflection (TIR), catadioptric or holographic optic element (HOE) equivalents are typical variants of lenslet 27a. Lens 27 or lenslets 27a are used with a wide variety of options known to those skilled in the art such as color, f-number, aperture size, etc. These may be obtained from various manufacturers including U.S. Precision Lens, Reed Precision Microstructures, 3M, Fresnel Optics Company, and Polaroid Corporation.

Referring simultaneously to FIGS. 1 and 2, one or more optional secondary optical elements 21 are used with the above-described conventional discrete LED designs (FIG. 1) or with LED array die-on-board designs (FIG. 2). Secondary optical elements 21 are components that influence by combination of refraction, reflection, scattering, interference, absorption, and diffraction the projected beam shape or pattern, intensity distribution, spectral distribution, orientation, divergence and other properties of the light generated by the LEDs. Secondary optical elements 21 comprise one or more of a lens 27, a deviator 28, and a diffuser 29, each of which may be in conventional form or otherwise in the form of a micro-groove Fresnel equivalent, a HOE, binary optic or TIR equivalent, or another hybrid form.

A deviator 28 may be optionally mounted on or attached to the housing 19 or otherwise attached to or made integral with the lens surface 27b and used to conveniently steer the collimated beam in a direction oblique to the optic axis of the lens 27 and/or reflector 26 used in the LED illuminator 10. Deviator 28 is normally a molded clear polycarbonate or acrylic prism operating in refractive mode for deviation angles up to about 35 degrees or in TIR mode (such as a periscope prism) for deviation angles in excess of 35 degrees. This prism may further be designed and manufactured in a micro-grooved form such as a Fresnel equivalent or a TIR equivalent. Furthermore, a diffraction grating, binary optic, or holographic optical element can be substituted for this prism to act as a deviator 28. In any of these cases, the deviator 28 is configured as a sheet or slab to substantially cover the entire opening of the illuminator housing 19 from which light is emitted. Such deviators are available from the same sources as the lens manufacturers listed above.

Optionally, a diffuser 29 may be mounted on or attached to the housing 19 or otherwise attached to or made integral with the lens surface 27b or the deviator surface 28a and is used to aesthetically hide and physically protect the illuminator internal components, and/or to filter the spectral composition of the resultant illuminator beam, and/or narrow, broaden or smooth the beam's intensity distribution. This can be helpful, for instance, in improving color and brightness uniformity of the effective illumination projected by the illuminator. Alternatively, diffuser 29 may include unique spatial filter or directional film such as Light Control Film (LCF) from 3M to sharpen the beam cut-off properties of the illuminator 10. The diffuser 29 may further incorporate a unique spectral filter (such as a tinted compound or an optical coating such as dichroic or band pass filter) to enhance illuminator aesthetics, hide internal illuminator components from external view, or correct the color of mixed light projected by the illuminator 10. Diffuser 29 is normally a compression or injection molded clear polycarbonate or acrylic sheet whose embossed surface or internal structure or composition modifies impinging light by refraction, reflection, total internal reflection, scattering, diffraction, absorption or interference. Suitable holographic diffusers 29 can be obtained from Physical Optics Corporation in Southern Calif., and binary optics may be obtained from Teledyne-Brown of Huntsville, Ala.

It is preferred to have as few optical members as practical and, therefore, at least two can be combined into one integral piece. For example, deviator 28 can be incorporated onto an upper surface 27b of lens 27 by simply placing an appropriately machined mold insert into the planar half of a mold for a Fresnel or TIR collimator lens. As mentioned hereinabove and shown in FIG. 2, diffuser 29 may also be attached to or made integral with the lens surface 27b or the deviator surface 28a. Procedures for consolidating the optical members will be known to those skilled in the art as will substituting various individual types of optical members for those listed above. All such combinations are intended to be within the scope of the present invention. Clearly, whether conventional discrete LEDs 14 or individual chips 16 are used, those skilled in the art will understand that many modifications may be made in the design of support member 12 while still staying within the scope of the present invention, and all such modifications should be understood to be a part of the present invention.

In accordance with the present invention, the plurality of conventional discrete LEDs 14 and individual LED chips 16 consists of two types whose emissions exhibit perceived hues or dominant wavelengths which are color-complementary and distinct from one another and which combine to form a metameric white light. To discuss what "metameric" and "complementary" mean in the present invention, one must understand several aspects of the art of producing and mixing light and the manner in which light made from that mixing will be perceived. In general, however, it is known that the apparent "color" of light reaching an observer depends primarily upon its spectral power distribution and upon the visual response of the observer. Both of these must therefore be examined.

Figure 3:
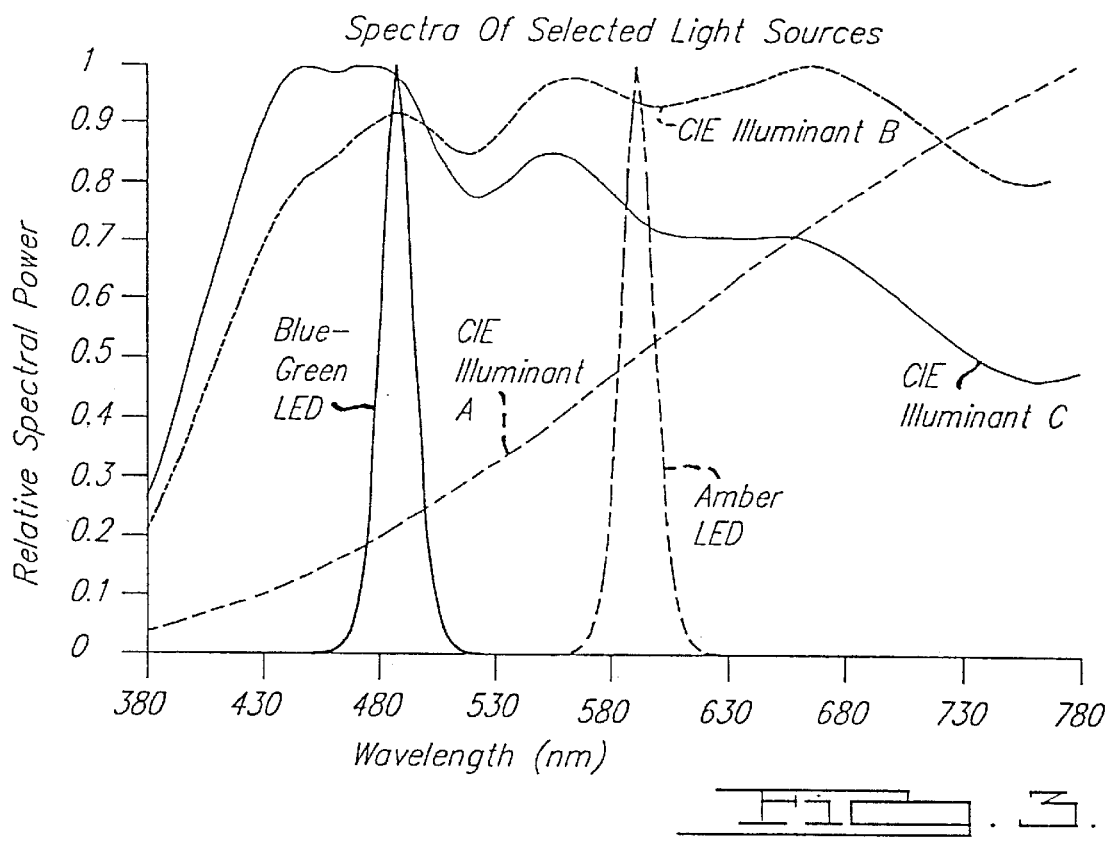
FIG. 3 is a graph plotting the relative spectral power versus wavelength for Standard Illuminants A, B, and C, as well as amber and blue-green LEDs.

FIG. 3 is a graph plotting the relative spectral power versus wavelength for Standard "white" Illuminants A, B, and C. The Standard Illuminants have been developed by the Commission Internationale de l'Eclairage (CIE) as a reference to reduce the complexity that results from colored objects undergoing appreciable changes in color appearance as the light source which illuminates them is changed. Standard Illuminant A is a source having the same relative spectral power distribution as a Planckian radiator at a temperature of about 2856 K. A Planckian or blackbody radiator is a body that emits radiation, because of its temperature, according to Planck's law. True Planckian radiators are ideal abstractions, not practical sources, but many incandescent sources emit light whose spectral composition and color bears a close approximation thereto. For instance, CIE Standard Illuminant A closely approximates the light emitted by many incandescent lamps such as a tungsten halogen lamp. It is convenient, therefore, to characterize the spectral power distribution of the radiation by quoting the temperature of the Planckian radiator having approximately the same relative spectral power distribution. Standard Illuminants B and C represent "true" daylight and sunlight, respectively; however, they have too little power in the ultraviolet region compared with that of daylight and sunlight.

All of these Illuminants are variations of white light and, as can be seen from FIG. 3, have broadband spectral power distributions. Incandescent light sources are typically solids that emit light when their temperatures are above about 1000 K and the amount of power radiated and the apparent color of this emission is directly related to the source temperature. The most familiar incandescent light sources are the sun, flames from a candle or gas lamp, and tungsten filament lamps. Such sources, similar to CIE Standard Illuminants A, B and C in FIG. 3, have spectral power distributions which are relatively constant over a broad band of wavelengths, are often referred to as broadband sources, and have colors which are perceived as nearly achromatic or white. Given the diversity of white-light sources and the associated range of near-white colors which are de facto accepted as white in various areas of practice, a color shall be deemed as white within the scope of the present invention, if it is substantially indistinguishable from or has color coordinates or tristimulus values approximately equal to colors within the white color boundary translated from the revised Kelly chart, within the SAE J578 achromatic boundaries, along the blackbody curve including Planckian radiators at color temperatures between 2000 K and 10,000 K, sources close to Standard Illuminants A, B, C, $D_{65}$, and such common illuminants as fluorescent F1, F2, F7, high pressure sodium lamps, xenon lamps, metal halide lamps, kerosene lamps or candles. These are all well known in the art and will be referenced and discussed hereinafter.

Unlike the other sources discussed, LEDs are narrow bandwidth sources. In addition to Standard Illuminants A, B, and C, FIG. 3 shows the spectral power distribution of two LEDs, one emitting a narrow-bandwidth radiation with a peak spectral power emission at 592 nanometers (nm) and the other at 488 nm. As can be seen by examination of this figure, the characteristic spectra of LEDs is radically different from the more familiar broadband sources. Since LEDs generate light by means of electroluminescence (instead of incandescence, pyroluminescence or cathodoluminescence), the emission spectra for LEDs are determined by the band gap of the semiconductor materials they are constructed of, and as such are very narrow-band. This narrow-band visible light emission characteristic is manifested in a highly saturated appearance, which in the present invention means they have a distinctive hue, high color purity, i.e., greater than about 0.8, and are therefore highly chromatic and distinctly non-white. Despite the narrow-band attributes of LED light, a combination of the emissions of two carefully selected LEDs can surprisingly form illumination which appears white in color, with color coordinates substantially identical to Standard Illuminants A, B or C.

Figure 4A:
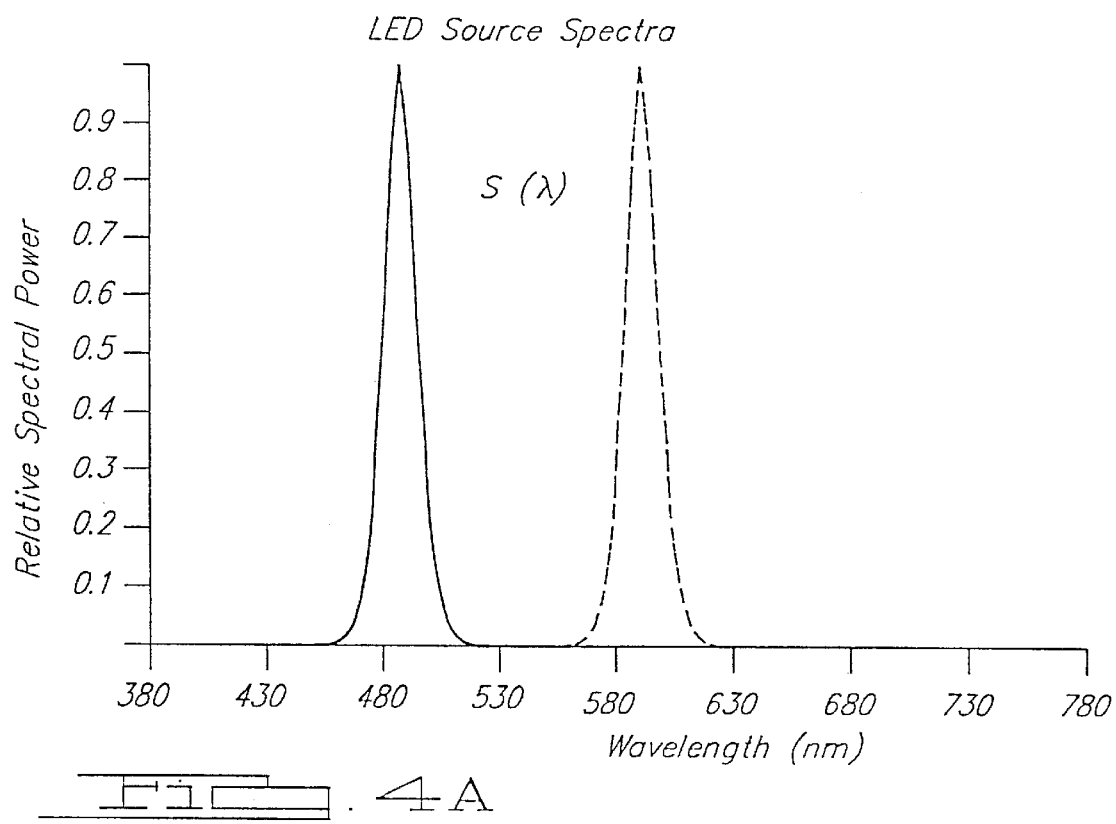
FIGS. 4a, 4b, and 4c are a series of graphs plotting the relative spectral power versus wavelength for amber and blue-green LEDs, the spectral reflectance versus wavelength for a 50 percent neutral gray target, and the relative spectral power versus wavelength for the resultant reflected light, respectively.
Figure 4B:
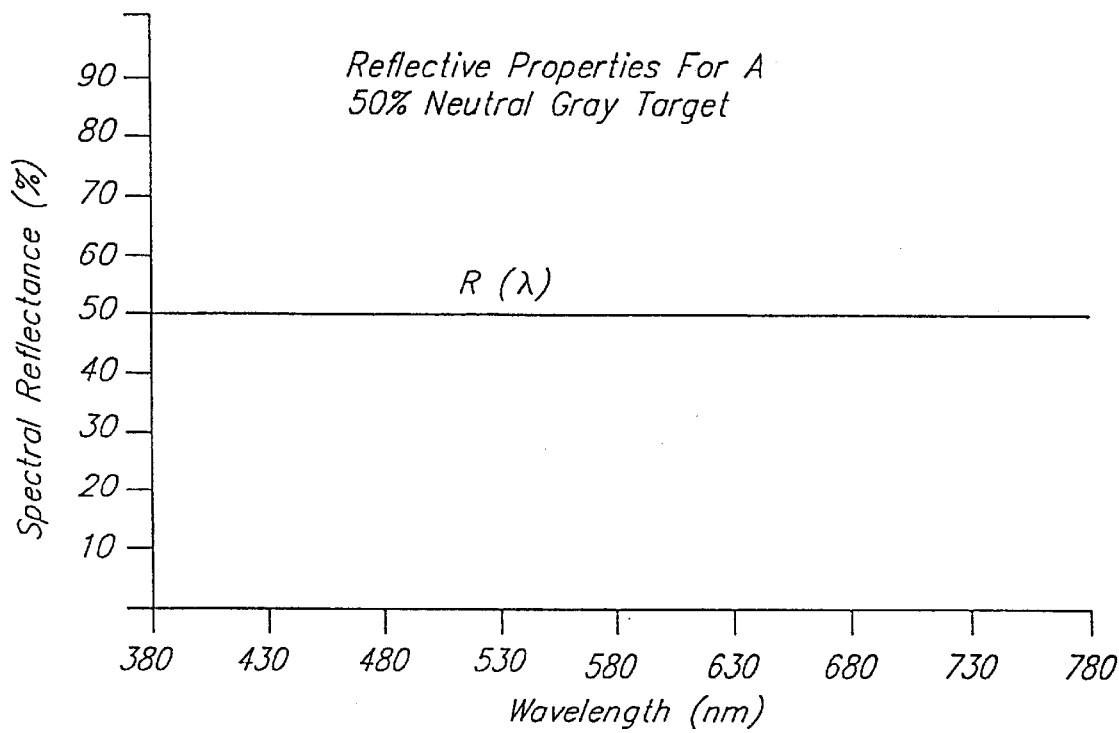
Figure 4C:
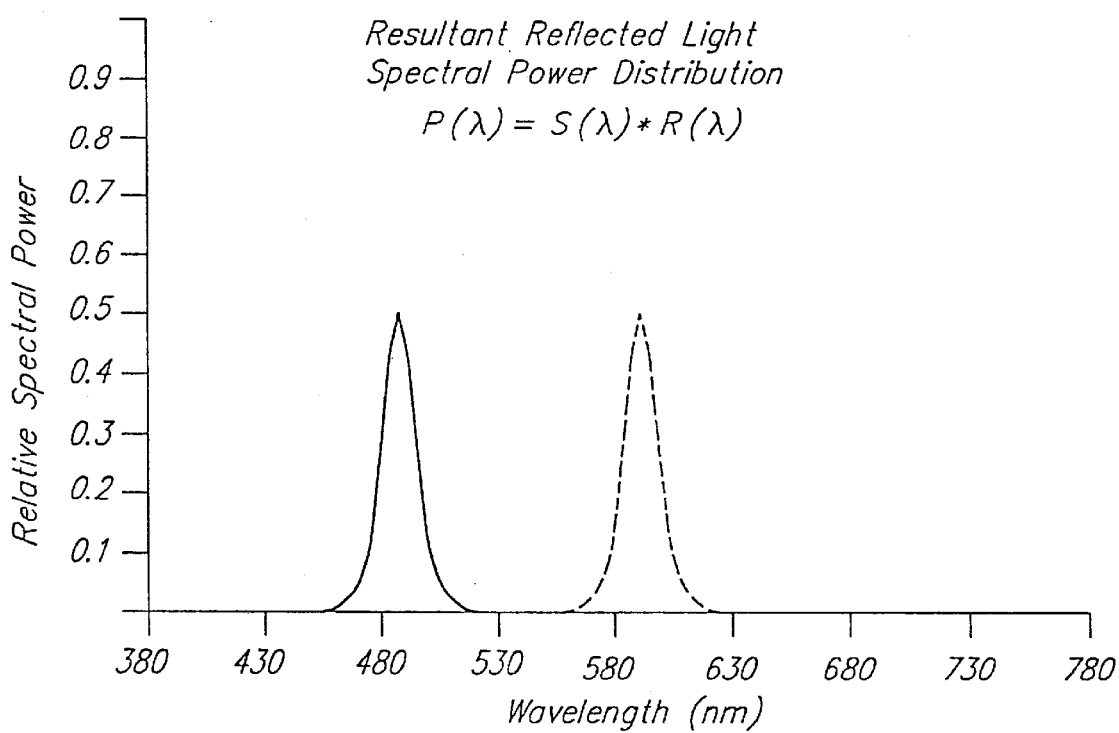

The reason for this is that, as mentioned hereinabove, the apparent color of light such as from a self-luminous source depends upon the visual response of the observer, in addition to the characteristics of the light from the source. In addition, the apparent color of a non-self-luminous object or surface (one which must be illuminated by a separate source in order to be seen) is slightly more complicated and depends upon the visual response of the observer, the spectral reflectance of the object or surface in question, and the characteristics of the light illuminating the object or surface. As illustrated in FIGS. 4a, 4b, and 4c, if a surface or object is a "neutral gray" diffuse reflector, then it will reflect light having a composition proportionally the same as the source which illuminates it, although invariably dimmer. Since the relative spectral power distribution of the light reflected from the gray surface is the same as the illuminating source, it will appear to have the same hue as the illuminating source itself. If the illuminating source is white, then the surface will appear white, gray, or black (depending on its reflectance). FIG. 4c shows the resultant spectral power distribution of the light emitted from a plurality of amber and blue-green LEDs and subsequently reflected from a 50 percent neutral gray target surface.

Figure 5:
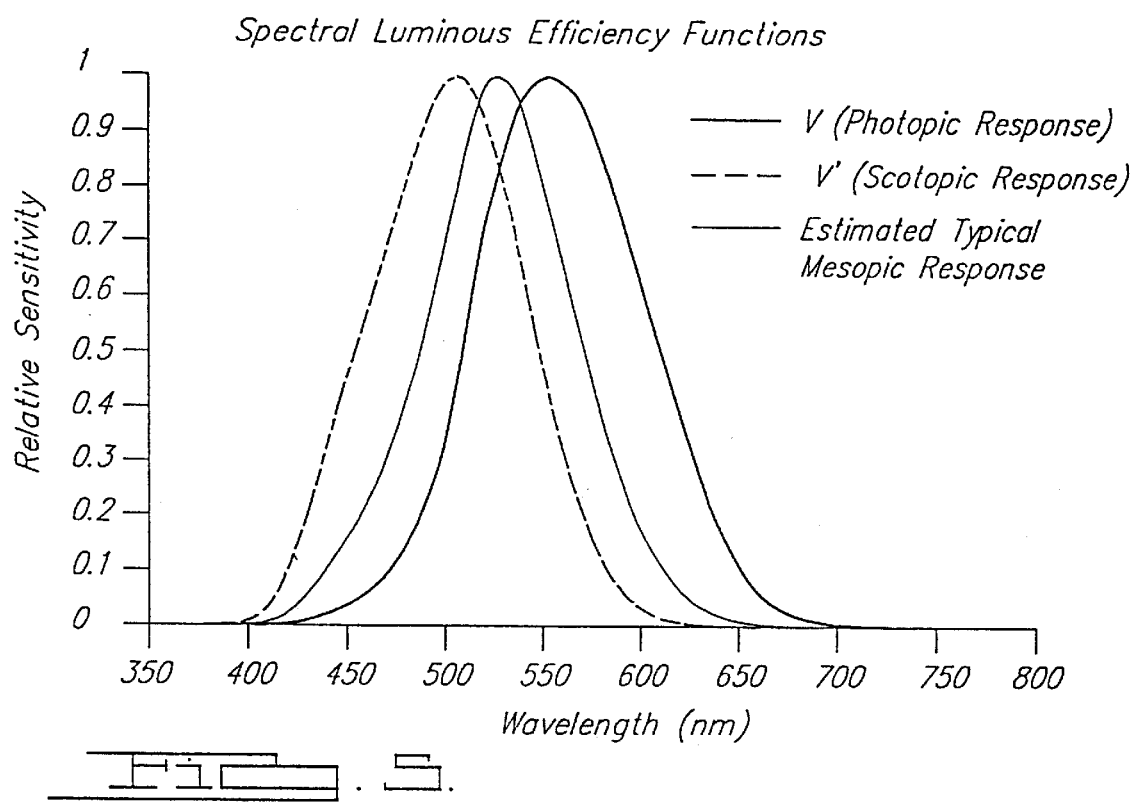
FIG. 5 is a graph plotting the relative sensitivity of a standard two degree observer versus wavelength for photopic vision, scotopic vision as well as an estimated mesopic vision.

As stated hereinabove, the visual response of an observer affects the apparent color of emitted and reflected light. For humans, the sensors or receptors in the human eye are not equally sensitive to all wavelengths of light, and different receptors are more sensitive than others during periods of low light levels. Cone receptors are active during high light levels or daylight and are responsible for color perception. Rod receptors are active during low light levels and have little or no sensitivity to red colors, but have a significant sensitivity to blue light. FIG. 5 is a graph plotting the relative sensitivity of a "standard observer" versus wavelength for the spectral luminous efficiency functions. The curve represented by V represents a standard observer's visual sensitivity to stimuli seen under photopic (or high light level) conditions of vision, and the curve V' represents a standard observer's visual sensitivity to stimuli seen under scotopic (or low light level) conditions of vision. As can be seen, the photopic response (V) has a nearly Gaussian shape with a peak at about 555 nm and the scotopic response (V') has a peak at about 508 nm. This difference between relative spectral sensitivity during photopic and scotopic conditions amounts to an enhanced blue response and diminished red response during darkness and is known as the Purkinje phenomenon. Scotopic conditions exist when observed surfaces have surface luminances of less than a few hundredths of a candela per square meter. Photopic conditions exist when observed surfaces have surface luminances of more than about 5 candelas per square meter. A transition range exists between photopic and scotopic vision and is known as mesopic (or middle light level) vision, represented by the intermediate curve in FIG. 5 which is an estimated typical mesopic response. Another primary difference between photopic, scotopic, and mesopic vision is the absence of color discrimination ability in scotopic conditions (very low light levels) and reduced color discrimination abilities in mesopic conditions. This will be discussed further hereinbelow.

The differences between photopic, mesopic, and scotopic viewing conditions are relevant to the present invention because an illuminator is used to illuminate areas during low light level conditions. Thus, before any illumination, the environment represents scotopic conditions of vision and during full illumination (after the eye has had time to adapt to the increased illumination), the environment is in the photopic conditions of vision. However, during the time the eye is adapting, and on the "outer fringes" of the illuminated region even after adaptation, the environment is in the mesopic conditions of vision. The eye's varying sensitivities to these different levels of illumination are very important in designing a proper illuminator.

Figure 6:
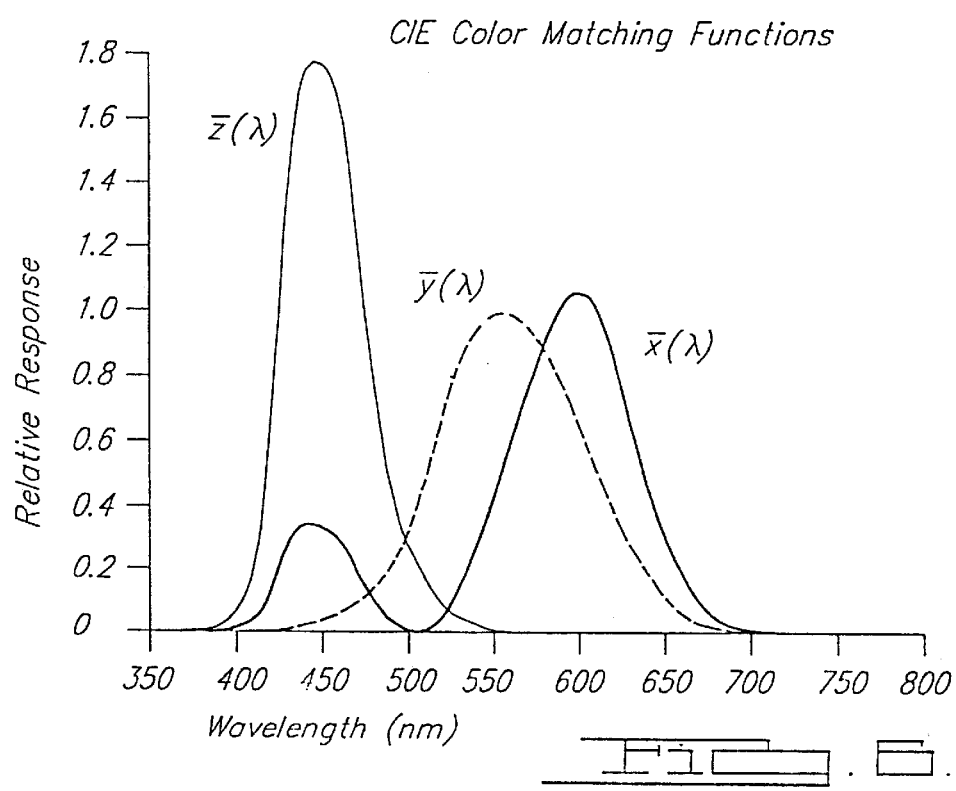
FIG. 6 is a graph plotting the relative response of the color-matching functions for a standard two degree observer versus wavelength during photopic vision.

The colors perceived during photopic response are basically a function of three variables, corresponding to the three different types of cone receptors in the human eye. There are also rod receptors, however, these only become important in vision at low light levels and are typically ignored in color evaluations at high light levels. Hence, it is to be expected that the evaluation of color from spectral power data should require the use of three different spectral weighting functions. FIG. 6 plots the relative response versus wavelength of the CIE color-matching functions for the 1931 standard 2 degree observer. The color-matching functions, $\bar{x}(\lambda)$, $\bar{y}(\lambda)$ and $\bar{z}(\lambda)$ relate to the sensitivity of the three types of cone receptors in the human eye to various wavelengths ($\lambda$) of light through a series of transforms. As can be seen by the curves in FIG. 6, the color-matching function $\bar{x}(\lambda)$ has a moderate sensitivity at about 450 nm, almost no sensitivity around 505, and a large sensitivity around 600 nm. Another color-matching function $\bar{y}(\lambda)$ has a Gaussian shape centered around 555 nm, and the third color-matching function $\bar{z}(\lambda)$ has a significant sensitivity centered around 445 nm.

As stated earlier, it is known that by combining a red color (such as a monochromatic source located at 700 nm and hereinafter designated as R), a green color (such as a monochromatic source located at 546 nm and hereinafter designated as G), and a blue color (such as a monochromatic source located at 435 nm and hereinafter designated as B) in proper ratios, virtually any color can be exactly matched. The necessary proportions of R, G, and B needed to match a given color can be determined by the above-described color matching functions $\bar{x}(\lambda)$, $\bar{y}(\lambda)$ and $\bar{z}(\lambda)$ as in the following example.

First, the amount of power per small, constant-width wavelength interval is measured with a spectraradiometer throughout the visible spectrum for the color to be matched. Then, the color matching functions $\bar{x}(\lambda)$, $\bar{y}(\lambda)$ and $\bar{z}(\lambda)$ are used as weighting functions to compute the tristimulus values X, Y and Z, by further using the following equations:

$$X = k[P_1 x(\lambda)_1 + P_2 x(\lambda)_2 + P_3 x(\lambda)_3 + \ldots P_n x(\lambda)_n] \quad [1]$$

$$Y = k[P_1 y(\lambda)_1 + P_2 y(\lambda)_2 + P_3 y(\lambda)_3 + \ldots P_n y(\lambda)_n] \quad [2]$$

$$Z = k[P_1 z(\lambda)_1 + P_2 z(\lambda)_2 + P_3 z(\lambda)_3 + \ldots P_n z(\lambda)_n] \quad [3]$$

where k is a constant; $P_{1,2,3,n}$ are the amounts of power per small constant width wavelength interval throughout the visible spectrum for the color to be matched and $\bar{x}(\lambda)_{1,2,3,n}$, $\bar{y}(\lambda)_{1,2,3,n}$ and $\bar{z}(\lambda)_{1,2,3,n}$ are the magnitudes of the color-matching functions (taken from the curves of FIG. 6) at the central wavelength of each interval. Finally, the approximate desired proportions of the above-described monochromatic sources R, G, and B are calculated from the above computed X, Y and Z tristimulus values using the following equations:

$$R = 2.365X - 0.897Y - 0.468Z \quad [4]$$

$$G = -0.515X + 1.426Y + 0.0888Z \quad [5]$$

$$B = 0.005203X - 0.0144Y + 1.009Z \quad [6]$$

Therefore, the color-matching functions of FIG. 6 can be used as weighting functions to determine the amounts of R (red), G (green) and B (blue) needed to match any color if the amount of power per small constant-width interval is known for that color throughout the spectrum. Practically speaking, R, G, and B give the radiant intensities of 3 monochromatic light is sources (such as lasers) with emissions at 700 nm, 546 nm and 435 nm, respectively, needed to match the chosen color.

Referring again to FIG. 3, the reason that the combined emissions from the two depicted LEDs will look like a broadband white-light source, even though they possess radically different spectral compositions, is because their combined emissions possess the same tristimulus values (as computed by Equations 1–3) as those of the broadband source Standard Illuminant B. This phenomenon is known as metamerism and is an essential aspect of the present invention.

Metamerism refers to a facet of color vision whereby two light sources or illuminated objects may have entirely different emitted or reflected spectral power distributions and yet possess identical tristimulus values and color coordinates. A result of metamerism is that additive mixtures of light from two completely different pairs of luminous sources (with their associated distinct spectra) can produce illumination having exactly the same perceived color. The principles and application of additive color mixing and metamerism to the present invention are discussed in greater detail later in this disclosure.

Figure 7:
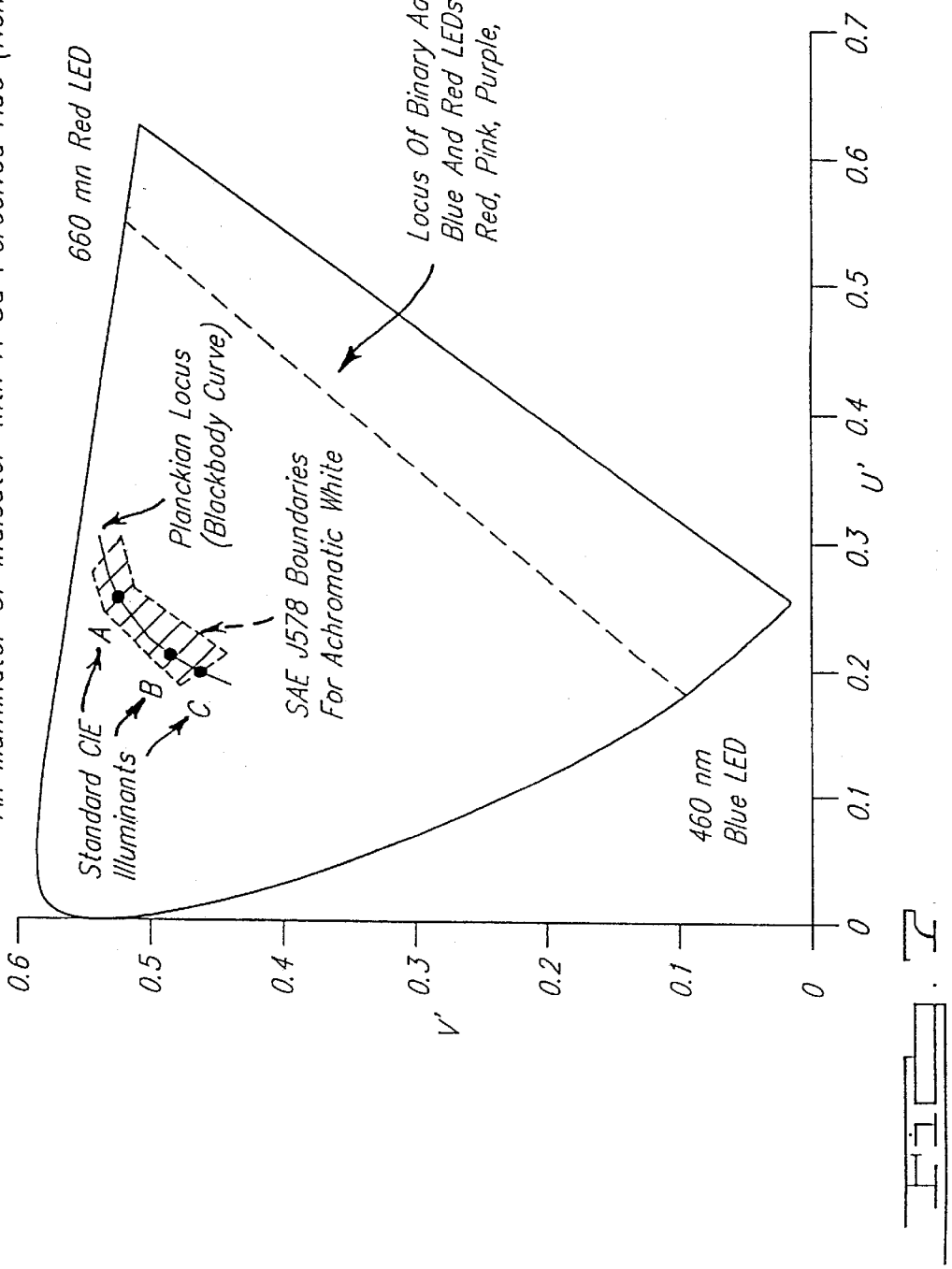
FIG. 7 is a CIE 1976 uniform chromaticity scale (UCS) diagram showing the location of the Planckian Locus, the location of the translated SAE J578 boundaries for achromatic white light, the locations of CIE Standard Illuminants A, B, and C as well as the locus of binary additive mixtures from blue and red LEDs.

FIG. 7 is a CIE 1976 uniform chromaticity scale (UCS) diagram, commonly referred to as the u', v' diagram. The u', v' diagram is used to conveniently provide numerical coordinates that correlate approximately with the perceptible color attributes, hue, and saturation. A UCS diagram is also used to portray the results of color matching computations, color mixing, and metamerism in a form that is well recognized in the art and is relatively easy to understand and use. Of course, exact color perceptions will depend on the viewing conditions and upon adaptation and other characteristics of the observer. In addition, other color coordinate systems are available, such as the CIE 1931 2 degree Chromaticity Diagram (commonly referred to as the x, y chart), CIELAB, CIELUV, Hunter and Munsell systems to name a few. For the sake of simplicity, the present invention is further described hereinbelow using the CIE 1976 UCS system. However, it should be understood that teachings of the present invention apply regardless of the color system used to describe the invention and therefore are not limited by this exclusive use of the CIE 1976 UCS system.

Referring again to FIG. 7, the location of a color on the u', v' diagram is obtained by plotting v' and u', where:

$$u'=4X/(X+15Y+3Z)=4x/(-2x+12y+3) \quad [7]$$

$$v'=9Y/(X+15Y+3Z)=9y/(-2x+12y+3) \quad [8]$$

and where X, Y, and Z are the tristimulus values described hereinabove (x and y correspond to the CIE 1931 Chromaticity x, y coordinates and are provided for convenient conversion). Thus, any color can be described in terms of its u' and v' values. FIG. 7 shows the respective positions on the u', v' diagram for the Planckian Locus, the SAE J578 boundaries for achromatic white light, Standard Illuminants A, B, and C, as well as the locus of binary additive mixtures from blue and red LEDs are shown. As can be seen, Standard Illuminants A, B, and C, closely corresponding to blackbody radiators, lie along the Planckian Locus.

The Planckian Locus is a curve on the u', v' diagram connecting the colors of the Planckian radiators at various temperatures, a large portion of which traverses the white, or achromatic region of the diagram. The SAE J578 achromatic white boundaries shown were translated from CIE 1931 Chromaticity x, y coordinates using Equations 6 and 7 hereinabove and are generally used to define what is an acceptable white light for automotive purposes (although many automotive white lights in use fall outside these boundaries).

Also shown in FIG. 7 is the range of colors produceable by a hypothetical additive color-combination of red (660 nm) and blue (460 nm) LEDs. FIG. 7 clearly shows how far off the Planckian Locus and the SAE J578 achromatic boundaries that the colors produced by this combination fall. In fact, the locus of binary additive mixtures from these blue and red LEDs has perceived hues of red, pink, purple, violet, and blue. This system would therefore not be suitable as the improved white-light illuminator of the present invention.

A white-light illuminator might in fact be constructed, however, from a three-color system. As stated hereinabove, a R-G-B combination can produce almost every conceivable color on the 1976 UCS diagram. Such a system would be complex and expensive, however, and/or would suffer from unacceptable manufacturing variations inherent to R-G-B systems.

Figure 8:
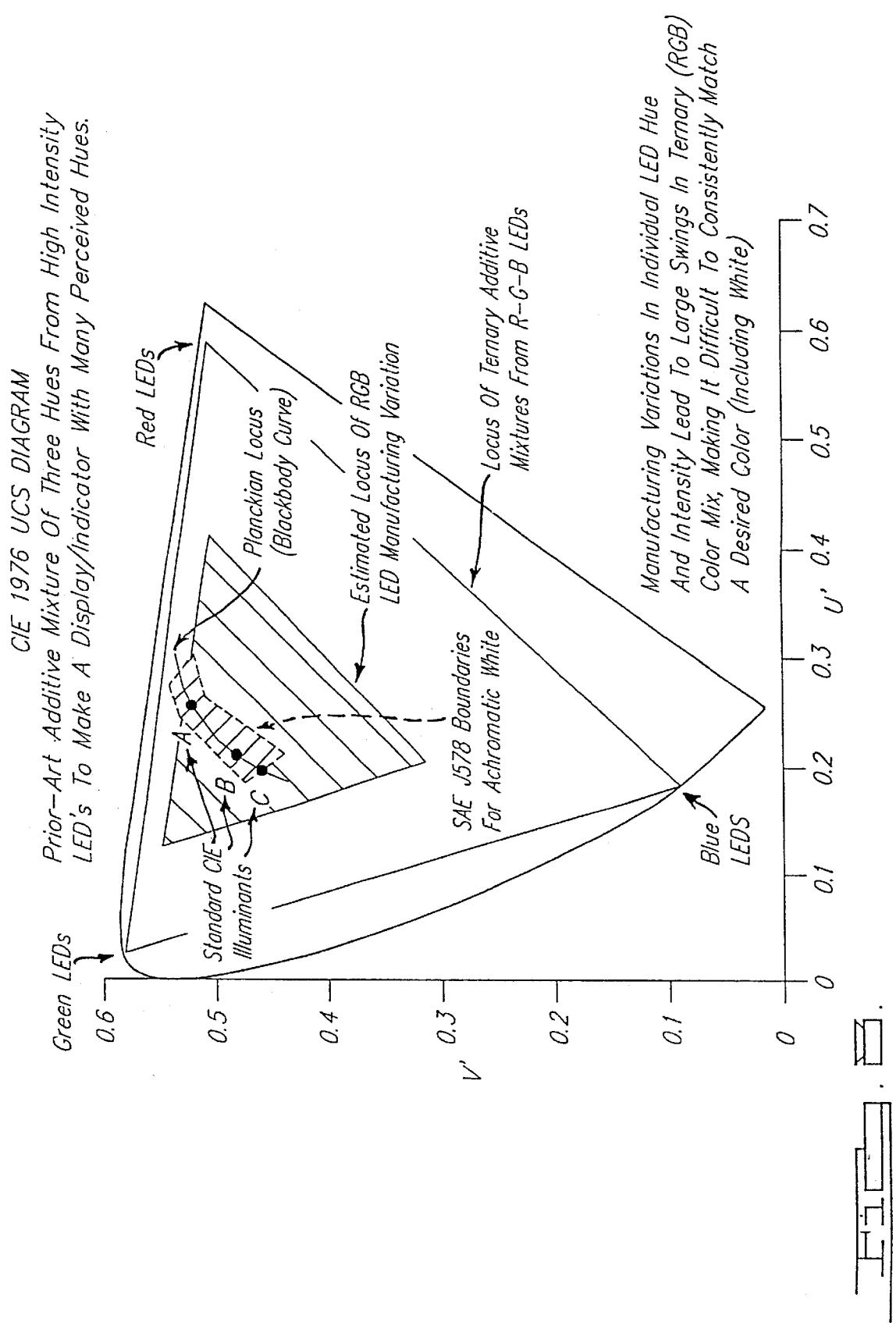
FIG. 8 is a CIE 1976 UCS diagram showing the location of the Planckian Locus, the locations of Standard Illuminants A, B, and C, the location of the translated SAE J578 boundaries for achromatic white light, the locus of ternary additive mixtures from red, green, and blue LEDs, as well as an estimated locus of red, green, and blue LED manufacturing variation.

This is illustrated best by reference to FIG. 8, which again shows the CIE 1976 UCS diagram, the Planckian Locus, and the translated SAE J578 boundaries. In addition, the locus of ternary additive mixtures produceable from hypothetical R-G-B LED configuration combinations and estimated manufacturing variations associated therewith are shown. Due to various uncontrolled processes in their manufacture, LEDs of any given type or color (including red, green, and blue) exhibit large variations from device to device in terms of their radiant and luminous intensities, and smaller variations in hue. As can be confirmed by reference to typical LED product literature, this variation can represent a 200 percent change in intensity from one LED to another or from one batch to another, even if the compared LEDs are of the same type and hue. Equations 7 and 8 clearly show the dependency of a color's u', v' coordinates upon its tristimulus values X, Y and Z, and Equations 4–6 show a linking dependency to source power (or intensity). Thus, variations in R-G-B LED intensity and hue will cause variations in the u', v' color coordinates of their mixed light. Therefore, it would be very difficult to construct a large number of R-G-B LED illuminators with any assurance that their light would reproducibly match a desired color such as a white. This is illustrated by the shaded area in FIG. 8 and is referred to as the Locus of R-G-B LED Manufacturing Variation.

Thus, with a red, green, and blue (RGB) combination, white light can be reproducibly created only if extraordinary measures were invented to ensure that the additive color mix proportions are maintained during LED and illuminator assembly production. This would involve extensive measurement and for every LED to be used or perhaps incorporation of active electronic control circuits to balance the LED output in response to some process sensor. The extra costs and complexity associated with such an approach, combined with the obvious complexity of supplying three different types of LEDs through inventory and handling systems, is daunting and renders such a configuration unsuitable for the illuminator applications of the present invention.

In the broadest sense, therefore, the present invention relates to producing nearly achromatic light by additively combining complementary colors from two types of colors of saturated LED sources or their equivalents. By complementary we mean two colors that, when additively combined, reproduce the tristimulus values of a specified nearly achromatic stimulus, e.g. a reference white. By appropriately tailoring the proportions of light from each of these two complementary colors, we produce a metameric white resultant color, or alternatively any other resultant color between the two complementary color stimuli (depending on the proportion of the additive mixture). Although the saturated sources of greatest interest are LEDs, whose emissions are narrow-band, the present invention clearly teaches that similar results could be achieved with other appropriately chosen narrow-band light sources.

Figure 9:
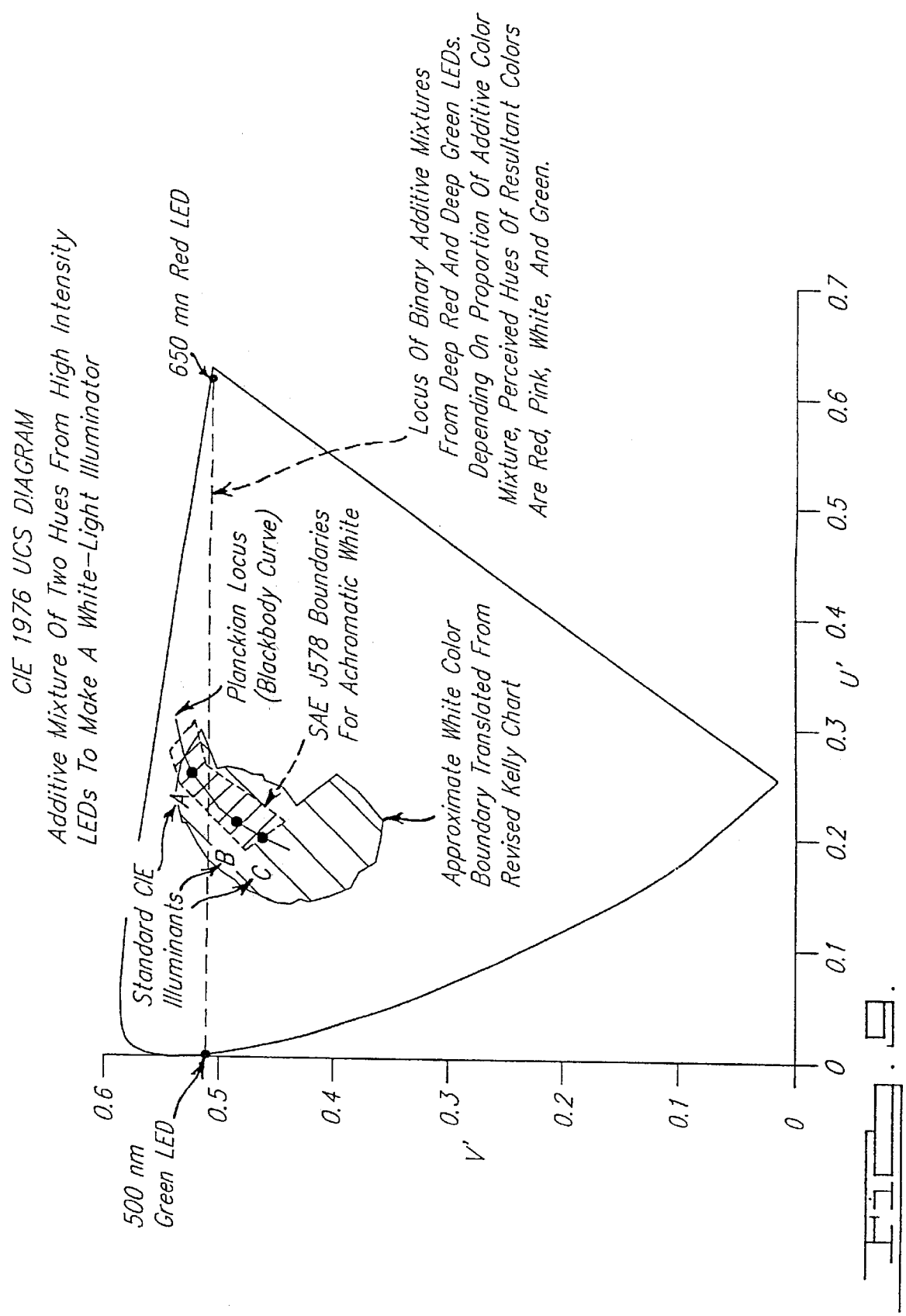
FIG. 9 is a CIE 1976 UCS diagram showing the location of the Planckian Locus, the locations of Standard Illuminants A, B, and C, the location of the translated SAE J578 boundaries for achromatic white light, and the approximate location of the white color boundary translated from the revised Kelly chart, as well as the locus of binary additive mixtures from deep red and deep green LEDs.

FIG. 9 is a CIE 1976 UCS diagram which broadly illustrates how the additive mixture of light from two LEDs having complementary hues can be combined to form a metameric white light. Also shown are the approximate boundaries of the "white" color region which has been translated from the revised Kelly chart and the CIE 1931 x, y Chromaticity Diagram. The Kelly chart and 1931 x, y Chromaticity Diagram are not shown but are well known in the art. FIG. 9 further depicts a first embodiment of the present invention utilizing a combination of one or more LEDs whose emissions have peak wavelengths of approximately 650 nm and 500 nm and perceived hues of red and green. As the diagram shows, this produces a "white" light located between Standard Illuminants A and B on the Planckian Locus.

It should be understood, however, from the above discussions that substantial variations inherent to conventional discrete and individual chip LEDs will cause changes in the coordinates of the resultant additive color mixture. The 650 nm LED depicted in FIG. 9 may fall into a range of LEDs with peak wavelengths ranging from 635 to 680 nm whose light has the hue of red, and the 500 nm LED depicted in FIG. 9 may fall into a range of LEDs with peak wavelengths ranging from 492 nm and 530 nm and whose light has the hue of green. In this embodiment, this variation, and more particularly the pronounced intensity manufacturing variations of the plurality of LEDs used, will cause the coordinates of the resultant mixture to traverse the u', v' chart in a direction generally substantially perpendicular to the Planckian Locus into either the yellowish pink or the yellowish green region of the u', v' diagram. Fortunately, as discussed hereinabove, there is some tolerance in the human visual system for acceptance of slightly non-white colors as effectively white. It should be understood that a similar mixture of red-orange or red LED light (with a peak wavelength between 600 nm and 635 nm or between 635 and 680 nm, respectively) with a complementary green LED light (with a peak wavelength between 492 nm and 530 nm) or a mixture of yellow-green or yellow LED light (with a peak wavelength between 530 nm and 572 nm) with a purple-blue or blue LED light (with a peak wavelength between 420 nm and 476 nm) can be made to function in the same manner to produce similar results and are included in the scope of this embodiment of the present invention. Thus, a system as described herein would function as an embodiment of the present invention if the other parameters were also met (such as projecting effective illuminance).

Figure 10:
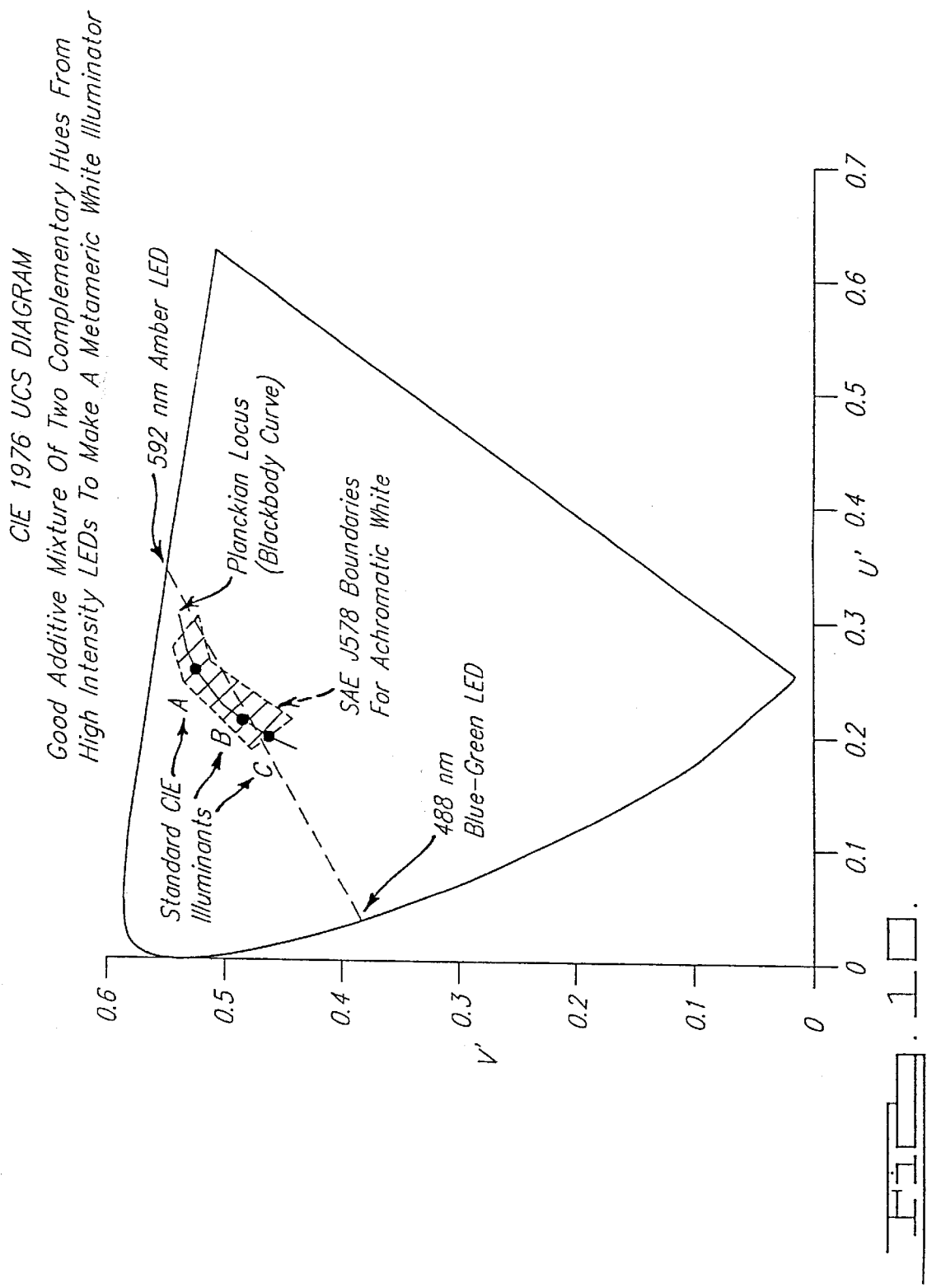
FIG. 10 is a CIE 1976 UCS diagram showing the location of the Planckian Locus, the locations of Standard Illuminants A, B and C, the location of the translated SAE J578 boundaries for achromatic white light, and the locus of binary additive mixtures from amber 592 nm and blue-green 488 nm LEDs which is substantially coaxial with the Planckian Locus.

A more preferred embodiment is illustrated in FIG. 10 which is a CIE 1976 UCS diagram illustrating a binary complementary combination of light from a plurality of LEDs of two different types having peak wavelengths of 592 nm and 488 nm and perceived hues of amber and blue-green, respectively, such that the light from the two types of LEDs overlaps and mixes with sufficient intensity and appropriate proportion to be an effective illuminator projecting white light. Although their spectra are very different from that of any Standard Illuminant, the mixed output of an amber LED and a blue-green LED appears surprisingly to be almost identical to Standard Illuminant B or C when viewed by a "standard" human observer. On FIG. 10, the u', v' coordinates of the nominal mixture occur at the intersection of this dashed line and the Planckian Locus, between Standard Illuminants A and B. Since the u', v' coordinates of the LED colors in this embodiment mark the endpoints of a line segment which is substantially coaxial with the Planckian Locus and the long axis of the SAE J578 achromatic white boundaries, any intensity variation deriving from manufacturing variations will produce colors along an axis remaining in close proximity to the Planckian Locus and within the boundaries of other widely-accepted definitions of white. This significantly simplifies the manufacturing process and control electronics associated with the illuminator, which decreases the overall production cost and makes commercialization more practical. In addition, we have found that of the many types and hues of LEDs presently available, the two preferred types of LEDs for the present invention have very high luminous efficacy in terms of light emitted compared to electrical power consumed. These are transparent substrate AlInGaP amber LEDs available from Hewlett Packard Inc., Optoelectronics Division located in San Jose, Calif., and GaN blue-green LEDs available from Nichia Chemical Industries, LTD located in Anan-shi, Tokushima-ken, Japan.

Figure 11:
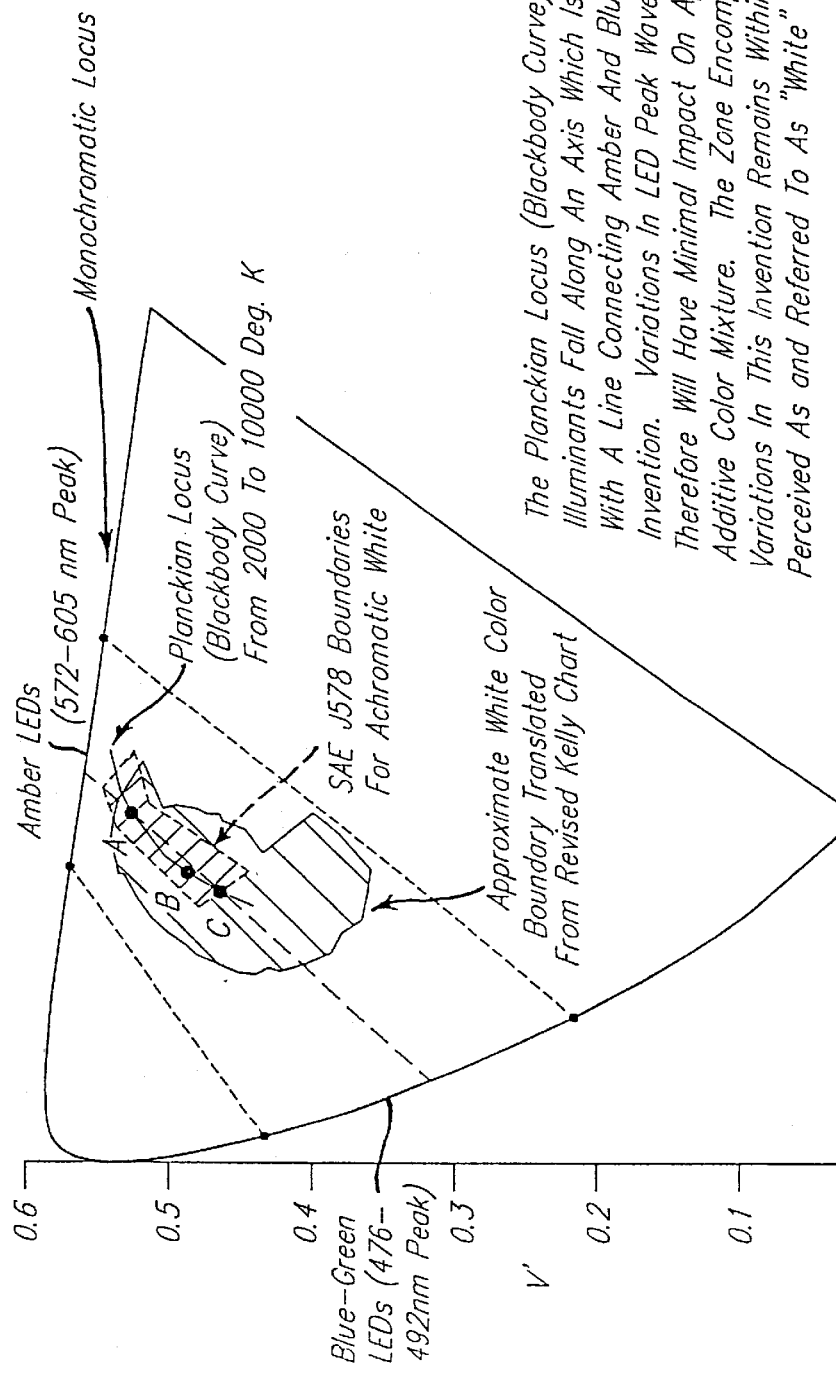
FIG. 11 is a CIE 1976 UCS diagram showing the location of the Planckian Locus, the locations of Standard Illuminants A, B and C, the location of the translated SAE J578 boundaries for achromatic white light, the approximate location of the white color boundary translated from the revised Kelly chart, and the locus of binary additive mixtures from a range of amber and blue-green LEDs which is substantially coaxial with the Planckian Locus.

FIG. 11 further amplifies this embodiment of the invention by illustrating issues of manufacturing variation within the context of other definitions of white. The hatched lines between amber (peak emission between 572 nm and 600 nm) and blue-green (peak emission between 476 nm and 492 nm) show the range in LED hue variations at either endpoint for this embodiment which would be generally capable of producing metameric white light. Since LEDs are solid-state devices comprising a base semiconductor material and one or more dopants which impact the spectral emission characteristics of the LED, the level of doping and other process parameters can be adjusted to intentionally modify the peak wavelength emitted by the LED. Furthermore, as discussed hereinabove, certain random variations also occur, affecting the additive color mixture. In this embodiment of the present invention, however, larger than normal variations can be tolerated. This is because a large part of the area between the hatched lines and within the monochromatic locus of the chart overlaps the areas commonly perceived as and referred to as white, such as the Planckian Locus, the marked region corresponding to the translated Kelly boundaries for the color white, or the shaded region corresponding to the translated SAE J578 boundaries for achromatic white. Therefore, all of the additive colors resulting from reasonable variations in the LED intensity and hue of this embodiment fall within one of the white regions. The figure thus clearly illustrates how there can be a range of amber LEDs whose hues are complementary with a range of blue-green LED hues which, when combined, form substantially white light.

The most preferred embodiment of the present invention uses a binary complementary combination of light from a plurality of LEDs of two different types having peak wavelengths of 584 nm and 483 nm and perceived hues of amber and blue-green, respectively, such that the light from the two types of LEDs overlaps and mixes with sufficient intensity and appropriate proportion to project effective white illumination. When plotted on a color chart, the u', v' coordinates of the light emitted by the LEDs of this embodiment mark the endpoints of an interconnecting line segment that is coaxial with the portion of the Planckian Locus which traverses Standard Illuminants A, B and C, as shown in FIG. 12.

As discussed hereinabove, intensity and hue variations are a natural by-product of random variations occurring in production of LEDs. For this embodiment of the present invention, however, the need for intensive in-process manufacturing controls and electronic controls integrated onto an illuminator assembly to compensate for inherent manufacturing variations for LEDs is largely eliminated. This is illustrated by the substantially coaxial relationship between the line connecting the u', v' coordinates of the preferred LEDs of the present invention and a best-fit linear approximation to the portion of the Planckian Locus from 2000 K to 10000 K. In addition, process controls, inventory management, materials handling, and electronic circuit design are further simplified by only having two colors to manipulate rather than three. This substantial simplification decreases manufacturing costs significantly and augments the present invention's capability for creating and projecting white light-the only color of light desired for the practical embodiments of the present invention.

The flexibility of the present invention is further amplified by application of additive color techniques to synthesize the end member constituents of the binary-complementary LED light mixture described hereinabove. This approach is best understood by reference to FIG. 13, which illustrates the use of additive sub-combinations of non-complementary LEDs to form effective binary complements corresponding to the two types of LEDs discussed hereinabove. Hues 1–7 represent the emissions from LEDs as follows: hue 1 is purple-blue or blue for LEDs with a peak wavelength between 420 nm and 476 nm, hue 2 is blue-green for LEDs with a peak wavelength between 476 nm and 492 nm, hue 3 is green for LEDs with a peak wavelength between 492 nm and 530 nm, hue 4 is yellow-green or yellow for LEDs with a peak wavelength between 530 nm and 572 nm, hue 5 is amber for LEDs with a peak wavelength between 572 nm and 605 nm, hue 6 is red-orange for LEDs with a peak wavelength between 605 nm and 635 nm, and hue 7 is red for LEDs with a peak wavelength between 635 nm and 680 nm. An additive mixture of light from one or more LEDs with hues 6 or 7 and one or more LEDs with hue 4 can be combined to form light having the same hue and substantially the same saturation as LED light with hue 5. Thus an equivalent or substitute for the amber LEDs of FIG. 11 is synthesized by additive combination of the emitted light from two types of LEDs whose emissions are characterized by hues 6 or 7 and 5, respectively. In a similar fashion, an additive mixture of light from one or more LEDs with hue 1 and one or more LEDs with hue 3 can be combined to form light having the same hue and substantially the same saturation as LED light with hue 2, thus synthesizing an equivalent or substitute for the blue-green LEDs of FIG. 11.

When a non-complementary sub-combination of LED light is used to synthesize an equivalent or substitute to one of the end members of the aforementioned binary complementary mixture, then the resultant light from the sub-combination is mixed with its binary complement or effective binary complement and projected via a lens and/or other optical elements to form an effective metameric white illumination. This can be important in commercial practice, where prolonged supply disruptions are common for LEDs of one variety or another due to explosive growth in market demand or insufficient LED manufacturer capacity. As explained herein, such a disruption can be mitigated in the case of the present invention by the use of sub-combinations of more readily available alternative LEDs to form equivalent complements.

FIGS. 14a–14c illustrate an illuminator of the present invention incorporated as a maplight within an automotive interior rearview mirror, however, it should be understood that the illuminator of the present invention may alternatively be incorporated into an automotive exterior rearview mirror as a security light or "puddle" light. The automotive rearview mirror 130 is provided with a housing 132 composed of a back wall 132a, a peripheral sidewall 132b having a top, bottom and endwall portion. The peripheral sidewall 132b defines a front opening adapted to receive a mirror element 134. A mounting bracket (not shown) may be provided for mounting the rearview mirror 130 on an automobile windshield (not shown) or headliner (not shown). The mirror element 134 may be a conventional prismatic mirror element as shown in FIGS. 14a and 14b or may be an electro-optic glare reducing mirror element such as an electrochromic or liquid crystal dimming mirror element well known in the art. It should be understood that, although FIG. 14 shows a conventional prismatic mirror element, the mirror element 134 is intended to represent any mirror element well known in the art including an electrochromic glare reducing mirror element without deviating from the scope of the present invention.

If an electrochromic glare-reducing mirror element is substituted as mirror element 134, the following list of patents provides an exemplary teaching of electro-optic devices in general and, more specifically, electrochromic rearview mirrors and associated circuitry. U.S. Pat. No. 4,902,108, entitled "Single-Compartment, Self-Erasing, Solution-Phase Electro-optic Devices Solutions for Use Therein, and Uses Thereof," issued Feb. 20, 1990, to H. J. Byker; Canadian Pat. No. 1,300,945, entitled "Automatic Rearview Mirror System for Automotive Vehicles," issued May 5, 1992, to J. H. Bechtel et al.; U.S. Pat. No. 5,128,799, entitled "Variable Reflectance Motor Vehicle Mirror," issued Jul. 7, 1992, to H. J. Byker; U.S. Pat. No. 5,202,787, entitled "Electro-Optic Device," issued Apr. 13, 1993, to H. J. Byker et al.; U.S. Pat. No. 5,204,778, entitled "Control System For Automatic Rearview Mirrors," issued Apr. 20, 1993, to J. H. Bechtel; U.S. Pat. No. 5,278,693, entitled "Tinted Solution-Phase Electrochromic Mirrors," issued Jan. 11, 1994, to D. A. Theiste et al.; U.S. Pat. No. 5,280,380, entitled "UV-Stabilized Compositions and Methods," issued Jan. 18, 1994, to H. J. Byker; U.S. Pat. No. 5,282,077, entitled "Variable Reflectance Mirror," issued Jan. 25, 1994, to H. J. Byker; U.S. Pat. No. 5,282,077, entitled "Variable Reflectance Mirror," issued Jan. 25, 1994, to H. J. Byker; U.S. Pat. No. 5,294,376, entitled "Bipyridinium Salt Solutions," issued Mar. 15, 1994, to H. J. Byker; U.S. Pat. No. 5,336,448, entitled "Electrochromic Devices with Bipyridinium Salt Solutions," issued Aug. 9, 1994, to H. J. Byker; U.S. Pat. No. 5,434,407, entitled "Automatic Rearview Mirror Incorporating Light Pipe," issued Jan. 18, 1995, to F. T. Bauer et al.; U.S. Pat. No. 5,448,397, entitled "Outside Automatic Rearview Mirror for Automotive Vehicles," issued Sep. 5, 1995, to W. L. Tonar; and U.S. Pat. No. 5,451,822, entitled "Electronic Control System," issued Sep. 19, 1995, to J. H. Bechtel et al. Each of these patents is commonly assigned with the present invention and the disclosures of each, including the references contained therein, are hereby incorporated herein in their entirety by reference.

In accordance with one embodiment of the present invention, the bottom portion of the housing peripheral sidewall 132b of mirror 130 has two openings 140a and 140b disposed therein such that a portion of the vehicle is illuminated therethrough. Two sets of a plurality of LEDs 114 are disposed within the housing 130 such that when energized by a power supply (not shown) and/or electronic control 122 a portion of the vehicle interior is illuminated through openings 140a and 140b. As is shown in FIG. 14a, openings 140a and 140b are disposed toward opposite ends of the bottom portion of peripheral sidewall 132b such that opening 140a illuminates the driver-portion of the vehicle interior and opening 140b illuminates the passenger-portion of the vehicle. For mirrors designed for certain foreign vehicles having a right-hand drive configuration, of course, opening 140a would correspond to the passenger-portion of the vehicle and opening 140b would correspond to the driver-portion.

Incorporating LEDs 114 into housing 132 to illuminate the vehicle interior through openings 140a and 140b has a number of advantages over prior art incandescent maplights as follows.

Incandescent illuminators operate by heating a metal filament, and-a significant portion of this heat radiates, conducts, and convects away from the bulb. This heat must be dissipated to reduce the chance of damage to the mirror assembly or other components within the mirror housing, e.g., electrochromic glare reducing element, compass, etc. Mechanisms for dissipating this heat are features such as heat sinks which assist with conductive and convective heat transfer, air vents or blowers which improve convection, or certain optical components or coatings which can help with radiative heat transfer. All of these typically add a disadvantageous combination of weight, volume, cost or complexity to the mirror assembly.

In addition, incandescent lights radiate light equally in all directions. This causes several problems such as having to incorporate large reflectors to direct the light toward the vehicle occupants. These reflectors in turn occupy critical space and add weight to the mirror assembly. Furthermore, light from the incandescent source that is not reflected by the reflector toward the occupants can cause glare to the driver and can also inhibit the proper operation of any electrochromic glare reducing layer by causing a false input to the glare and/or ambient light sensors incorporated therein. LEDs, whether the conventional discrete type with integral optics or individual semiconductor die with separate optics, are very small and therefore the reflector assemblies or other optics used with them do not add significantly to the weight or volume of the mirror assembly. In addition, several LED chips may be incorporated into one package for even further reduction in size.

As weight is added to the mirror assembly, greater stress is placed upon its mounting structures and its resonant vibration characteristics change. Greater stress on the mounting mechanism due to any increase in weight can lead to premature failure of the mounting mechanism, particularly if the mount is of the type which attaches by means of adhesive to the interior surface of the windshield. The added weight can also cause a decrease in resonant frequency and increase in vibrational amplitude, degrading the clarity of images reflected in the mirror during vehicle operation. In addition to being a safety concern, premature mount failure or increased vibration signature clearly would be displeasing to the vehicle owner.

As automobiles become more complex, more and more option-components are being incorporated in the mirror housing. For example, remote keyless entry systems, compasses, indicia for direction, tire pressure, temperature, etc., are being incorporated into mirror housings. Since there is limited space in a mirror housing, decreasing the volume of every component within the housing is necessary. The additional space required to cool an incandescent lamp and collimate its light severely complicates the inclusion of these other desirable features.

Conversely, LEDs do not operate at high temperatures and thus create fewer heat dissipation problems and the space problems associated with heat dissipation measures.

Because individual LED chips are extremely small, typically measuring 0.008 inches×0.008 inches×0.008 inches, they approximate a point source better than most incandescent filaments and the collimating optics (such as lenses and reflectors) used with either the conventional discrete LEDs or chip-on-board LEDs can perform their intended function with much greater effectiveness. The resultant LED illuminator projects a more uniform and precisely tailored and directed intensity distribution.

LEDs have an extraordinarily long life compared with the typical 1,000–2,000 hour life for incandescent lights. A typical LED will last anywhere from 200,000 to 2 million hours, depending on its design, manufacturing process, and operating regime. LEDs are also much more rugged than incandescent bulbs; they are more resistant to mechanical shock and vibration, thermal shock and impact from flying debris. They further are virtually impervious to the on-off switching transients which cause substantial reliability problems for incandescent systems. The lifetime and reliability advantage is significant, and when coupled with their inherent ruggedness, the advantage of using LEDs becomes striking.

Figure 21:
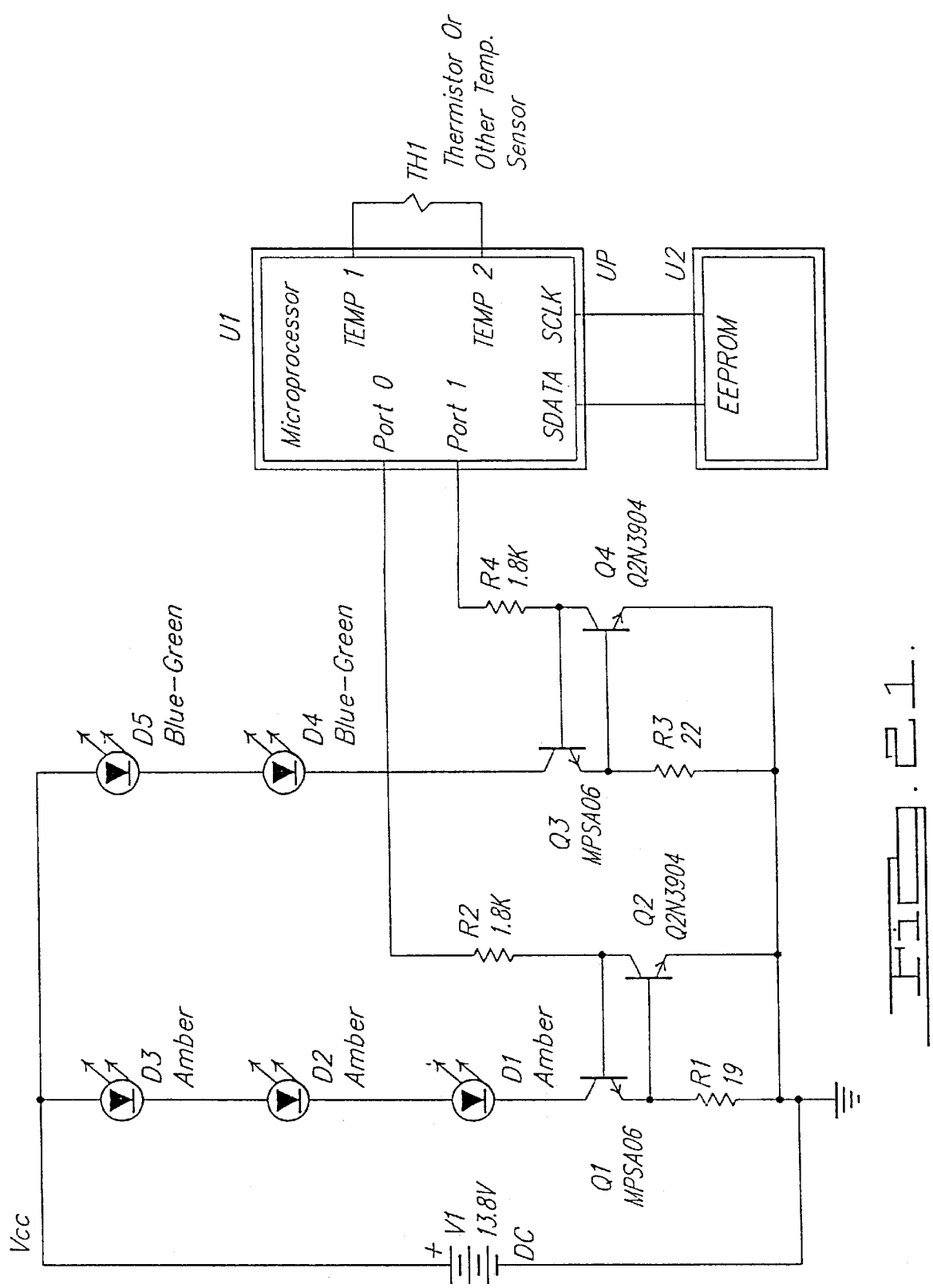
FIG. 21 is a schematic diagram of an electronic circuit operable to power the illuminator assembly of the present invention.

Comparing an amber LED (Part No. HLMT-DL00, from Hewlett Packard) with a 0.72W power dissipation from the circuit in FIG. 21, with a Philips type 192 lamp run at 13.0 Volt, using the method set forth in Military Specification HDBK-217F-1, illustrates the significant disparity in calculated failure rate. The results show that the amber LED would have a 0.17 percent failure rate whereas the incandescent lamp would have a failure rate of 99.83 percent over the same time period.

In exterior rearview mirrors, these issues are further amplified, due to the more severe shock and vibration conditions, as well as environmental exposures such as rain, snow, temperature fluctuations, UV radiation exposure, and humidity which prevail in the outdoor environment. This makes incorporating an incandescent lamp into an outside rearview mirror even more difficult in that it must be protected from these factors. Regardless of the measures undertaken to prevent failure of incandescent lamps incorporated into an automotive interior mirror map light assembly or into an automotive exterior mirror security light assembly, these lamps have such a short life that means must be provided for replacing the light bulbs without having to replace the entire mirror assembly. Unfortunately, a design which allows for easy replacement typically is not as effective at protection, further increasing the probability of early failure. This makes the task of protecting the bulb from environmental factors difficult and costly to design and manufacture. LEDs, on the other hand, have an extremely long life and are generally very highly resistant to damage from vibration, shock, and other environmental influences. Therefore, LEDs last much longer than the life of the mirror assembly and the vehicle itself, and the design of the mirror assembly need not include means for replacing the LEDs.

White-light LED illuminators of the present invention can be very compact and thus can be incorporated into automotive rearview mirrors in a manner with much greater aesthetic appeal than with prior-art incandescent systems.

Finally, incandescent lamps possess very low electrical resistance when first energized until they heat up to incandescence and therefore draw an inrush current which can be 12–20 times their normal operating current. This inrush places tremendous thermo-mechanical stresses on the filament of the lamp, and commonly contributes to premature failure at a fraction of rated service life (much shorter than the service life of a vehicle). Inrush current also stresses other electronic components in or attached to the illuminator system such as the power supplies, connectors, wire harnesses, fuses and relays such that all of these components must be designed to withstand repeated exposure to this large transient. LEDs have no inrush current and therefore avoid all of these issues.

The "bloom time" for an incandescent lamp or time it takes for the lamp to become fully bright after its supply voltage is initially applied is very long—in excess of 0.2 seconds for many lamps. Although extremely fast response times are not mandatory in a vehicle maplight, a fast response characteristic is advantageous for electronic control of intensity and color mix proportions as discussed below. Further, certain binary complementary metameric white LED illuminator applications such as lamps aiding surveillance may benefit from a strobe-like ability to become bright quickly upon electronic activation.

In accordance with one embodiment of the present invention the plurality of LEDs 114 behind each opening 140*a* and 140*b* may be any combination of two types of LEDs whose emissions have hues which are complements to one another (or a combination of equivalent binary complements formed from non-complementary sub-combinations of LED light) such that the light from the two groups combines to project effective white illumination; however, as stated above, the preferred LEDs 114 disposed in each of the openings 140*a* and 140*b* are a combination of amber LEDs and blue-green LEDs. When energized, these two types of LEDs produce light having hues which are color complements, and, when combined in the proper proportions, their resultant beams overlap and mix with sufficient intensity to be an effective illuminator projecting substantially white light. More specifically, at least two amber LEDs such as a transparent substrate AlInGaP type from Hewlett Packard Corporation, Optoelectronics Division should be combined with at least one blue-green LED such as a GaN type LED from Nichia Chemical Industries, LTD. in each of openings 140*a* and 140*b;* the most preferred combination is 3 or 4 amber LEDs to 2 or 3 blue-green in each of openings 140a and 140b. This combination produces white light with an effective illumination to illuminate a portion of a vehicle's interior to assist the occupants in reading maps, books, and the like.

As stated above, an area of effective illumination occurs at some distance away from the illuminator. Effective illumination is an important aspect of the present invention and, in the art of automotive maplights, is partly determined by auto manufacturer specifications. For example, FIG. 15 indicates what one auto manufacturer requires as an acceptable illuminance for a rearview mirror having an integral map lamp. The illuminance measurements must be recorded for the driver's side at points 1–13. The average illuminance at points 1–5 must be no less than 80 lux with the minimum measurement of these points no less than 13 lux; the average illuminance at points 6–9 must be no less than 30 lux with the minimum measurement of these points no less than 11.5 lux; and the average intensity at points 10–13 must be no greater than 30 lux (to avoid glare). The illuminance measurements must be recorded for the passenger's side at points 14–26 and the average illuminance at points 14–18 must be no less than 80 lux with the minimum measurement of these points no less than 13 lux; the average illuminance at points 19–22 must be no less than 30 lux with the minimum measurement of these points no less than 11.5 lux; and the average illuminance at points 23–26 must be greater than 30 lux.

FIG. 16 illustrates schematically how the illuminator 10 of the present invention meets the above specifications. A section view is shown of an illuminator 10 similar to that of FIG. 1, but with five conventional discrete T 1¾ LEDs 14 (three amber and two blue-green) illuminating a target surface at a distance R1, which is approximately 22 inches for an automotive interior mirror maplight. The points labeled T1–T7 represent reference points on a target at which minimum and/or maximum illuminance requirements are typically specified. The figure also illustrates overlapping beams from a plurality of two different types of LEDs which are emitting light having complementary hues, e.g., blue-green and amber. The beams of the plurality mix as they travel outward from the LEDs, overlapping to give a greater illuminance and form a binary-complementary additive color mixture of metameric white light. It should be understood that, for some uses of the illuminator of the present invention, such as a pocket flashlight, it is sufficient to use a plurality consisting of a single amber LED and a single blue-green LED of the types described above. Of course, other applications of the illuminator, such as an electric bicycle headlamp, require many more of each type of LED in order to meet industry and regulatory specifications.

An important criterion for an effective illuminator is that its projected light must conform to accepted definitions of white light as previously described at reasonable operating ranges. Inasmuch as the additive complementary color mixture of the present invention depends on overlapping of projected beams from the member LEDs of the plurality in the illuminator, it is important to understand that each illuminator of the present invention will have a minimum operating distance for well-blended metameric white light. Depending on the actual LED array and associated optics utilized in a given embodiment, this distance will vary widely. Typically, good beam mixing (and thus balanced additive complementary light combination to produce reasonably uniform white light) requires a minimum operating range of about 10 times the average distance between each LED and its nearest color complement in the plurality. This minimum operating range for good beam mixing is very dependent on the application requirements and optics used, however, and can be a much larger multiple of complementary LED pitch spacing. For an automotive map light illuminator incorporated of the present invention as illustrated in FIGS. 14 and 16 into an interior rearview mirror assembly, a typical dimension between complementary conventional discrete T 1¾ LEDs in the plurality is about 0.4 inches and the minimum distance for reasonably uniform white illumination is about 12 inches. Since the specified target for this embodiment is 22 inches away, this minimum operating range for uniform white illumination presents no problem.

It should be noted that the illuminator of the present invention does project illumination at ranges shorter than this specified range (as well as longer). The color and illuminance level of the projected light is typically not as uniform at shorter ranges, however.

The pitch spacing between LEDs, array size of the plurality of the LEDs in the illuminator, and the characteristics of the collimating optics and diffusers used determine the distribution of constituent light in the illuminator's beam. Fortunately, these can be tailored to meet almost any desired combination of far-field intensity distribution, aperture, beam cut-off angle, color uniformity, and minimum operating range for effective uniform white illumination. For an electric bicycle headlamp, the predetermined distance for effective white illumination may be 5 feet and conventional discrete LEDs may be suitable as the plurality in the illuminator. For an instrument panel indicia backlight, however, the predetermined distance for effective uniform illumination may be 0.25 inches or less and a chip-on-board LED array using low f# lenslets will almost certainly be required.

Referring again to FIG. 16, the level of mixing of light from the five LEDs, as well as the luminous output, depend on the distance R1 and also depend on the distance D between complementary LEDs. If the LEDs in the plurality are packed closer together, the light mixes completely at a shorter projected distance and the uniformity of the color and illuminance of the combined beam is improved. The pitch spacing D between complementary LEDs in the plurality can vary widely from approximately 0.020 inches (for a chip-on-board LED array) to as much as 3 inches for a spotlight or greater for various floodlight applications, but is preferably as small as possible. Conventional discrete LEDs often have their own integral optical elements assembly, and therefore, there is a limit on how closely they can be packed together. The five T 1¾ LEDs used to gather the above data were placed in a row approximately 0.4 inches apart.

Irrespective of whether conventional discrete LEDs or individual dies are used, an optical element should be incorporated into the illuminator assembly to direct the generated light toward the desired surface and influence the distribution of the intensity generated by the LEDs through the use of one or more of a lens, a diffuser, a reflector, a refractor, a holographic film, etc. as discussed hereinabove.

For the automotive maplight illuminator of FIGS. 14 through 20, two blue-green GaN T 1¾ LEDs from Nichia were operated at 24.5 milliamps and the three amber TS AlInGaP T 1¾ *LEDs from Hewlett Packard were operated at about* 35 milliamps. A 10 degree embossed holographic Light Shaping Diffuser (LSD) from Physical Optics Corporation was used to smooth and distribute the illuminator beam.

Figure 17:
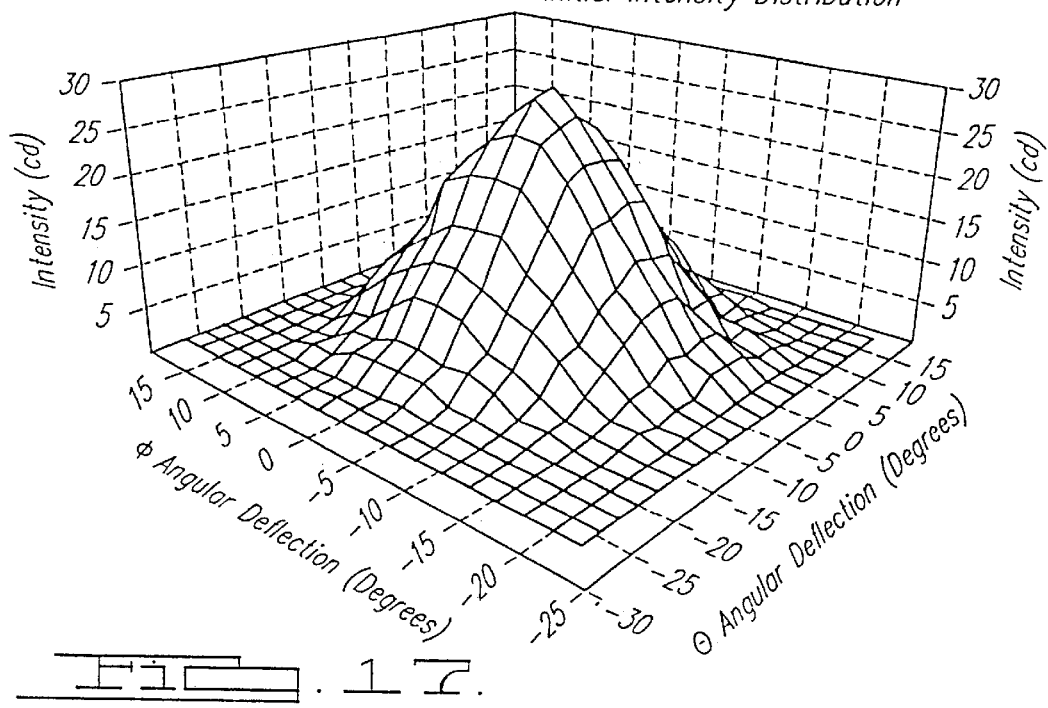
FIG. 17 is a perspective three-dimensional chart plotting the intensity distribution from an illuminator maplight according to the present invention borne by an automotive interior electrochromic mirror.
Figure 18:
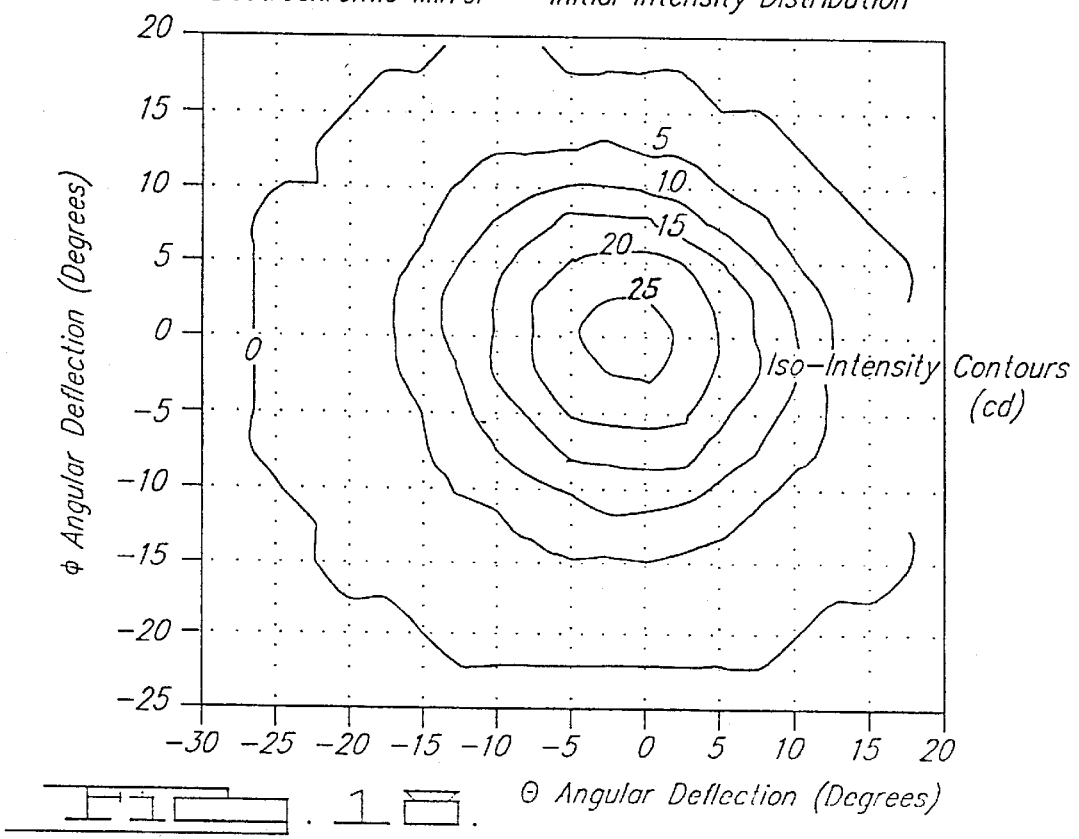
FIG. 18 is an iso-intensity contour chart plotting the intensity distribution from an illuminator maplight according to the present invention borne by an automotive interior electrochromic mirror.

FIG. 17 shows a perspective three-dimensional representation of the intensity distribution from an automotive interior maplight illuminator embodiment of the present invention. The Gaussian aspect of this plotted surface shows an important benefit of the present invention—that the intensity distribution of the illuminator is easily crafted to be a smoothly varying, monotonic function with respect to angular deflection from the primary optical axis of the illuminator. In contrast to this, many prior art illuminators are prone to intensity irregularities which can cause localized visibility distortions in the target area to be illuminated. FIG. 18 is a two-dimensional contour plot amplifying the intensity information given in FIG. 17 for the same illuminator.

In order for an LED illuminator to be effective, the projected beams from the plurality of LEDs must overlap one another, such that, as discussed hereinbefore, a complementary color mixture occurs to produce metameric white light. In addition, the illuminator must project sufficient intensity in a desired direction to illuminate objects or surfaces at that distance to a light level where useful visual discrimination is possible, even in low ambient light conditions. Useful visual discrimination requires color contrast and luminance contrast between separate objects or images and this demands enough light for color vision to occur, that is photopic or mesopic conditions. Photopic vision occurs when viewing objects or surfaces which have a surface luminance greater than approximately 5 candelas per square meter (5 nit), whereas Mesopic vision can reasonably be expected when viewing objects or surfaces which have a surface luminance greater than approximately 0.5 candela per square meter (0.5 nit). For surfaces which are neutral gray, Lambertian, and have a reflectance factor of 50 percent or more, Photopic and Mesopic levels of surface luminance will therefore occur with illuminances of approximately 30 lumens per square meter (30 lux) and 3 lumens per square meter (3 lux), respectively. For an illuminator 1 meter removed from this surface, the required intensity for Photopic and Mesopic vision are therefore 30 candelas and 3 candelas, respectively. The relationships between intensity, illuminance, and luminance are well known in the art and will not be discussed in further detail herein.

Figure 15:
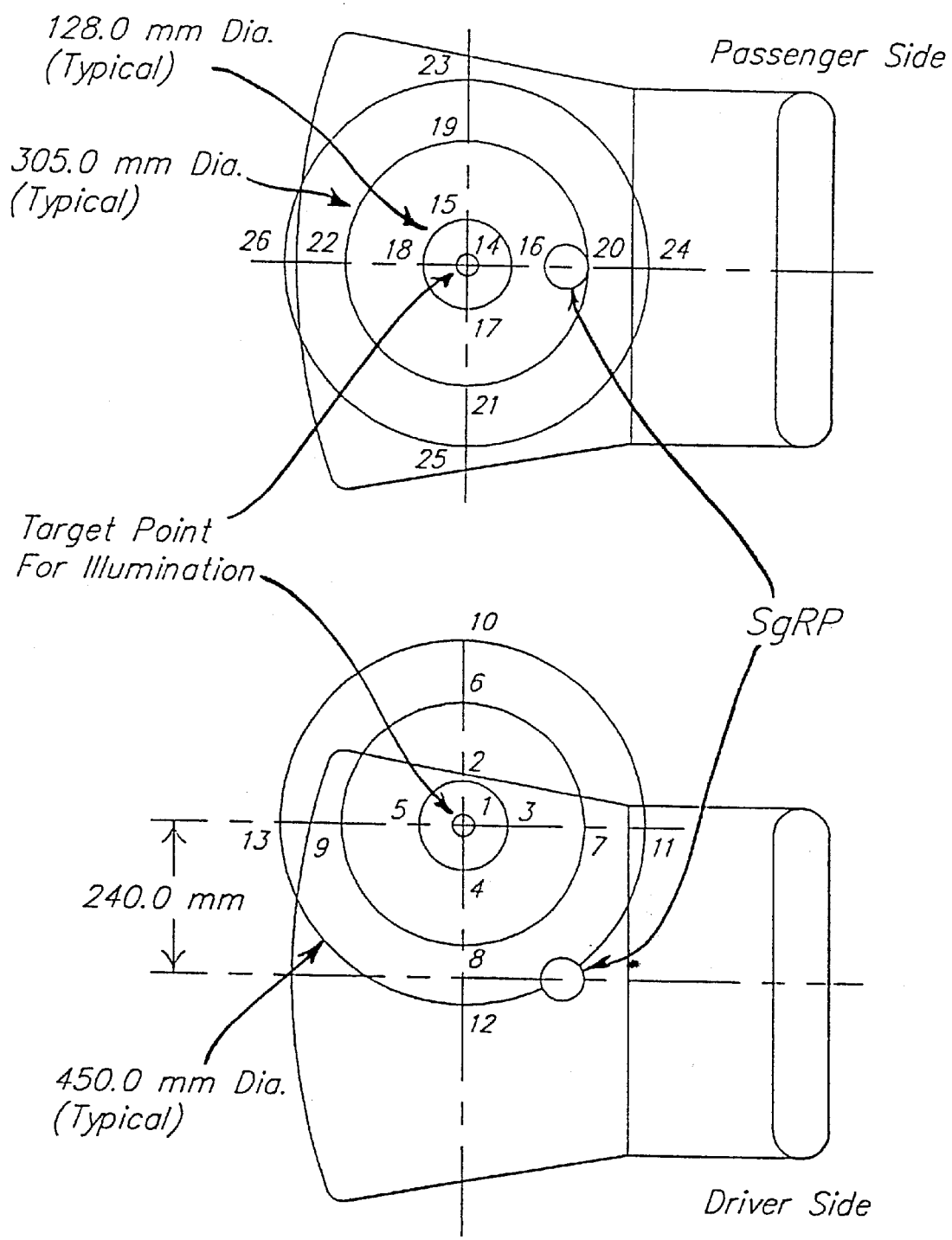
FIG. 15 is an illustration of a specification for an area targeted by illumination from an automotive interior rearview mirror maplight.
Figure 19:
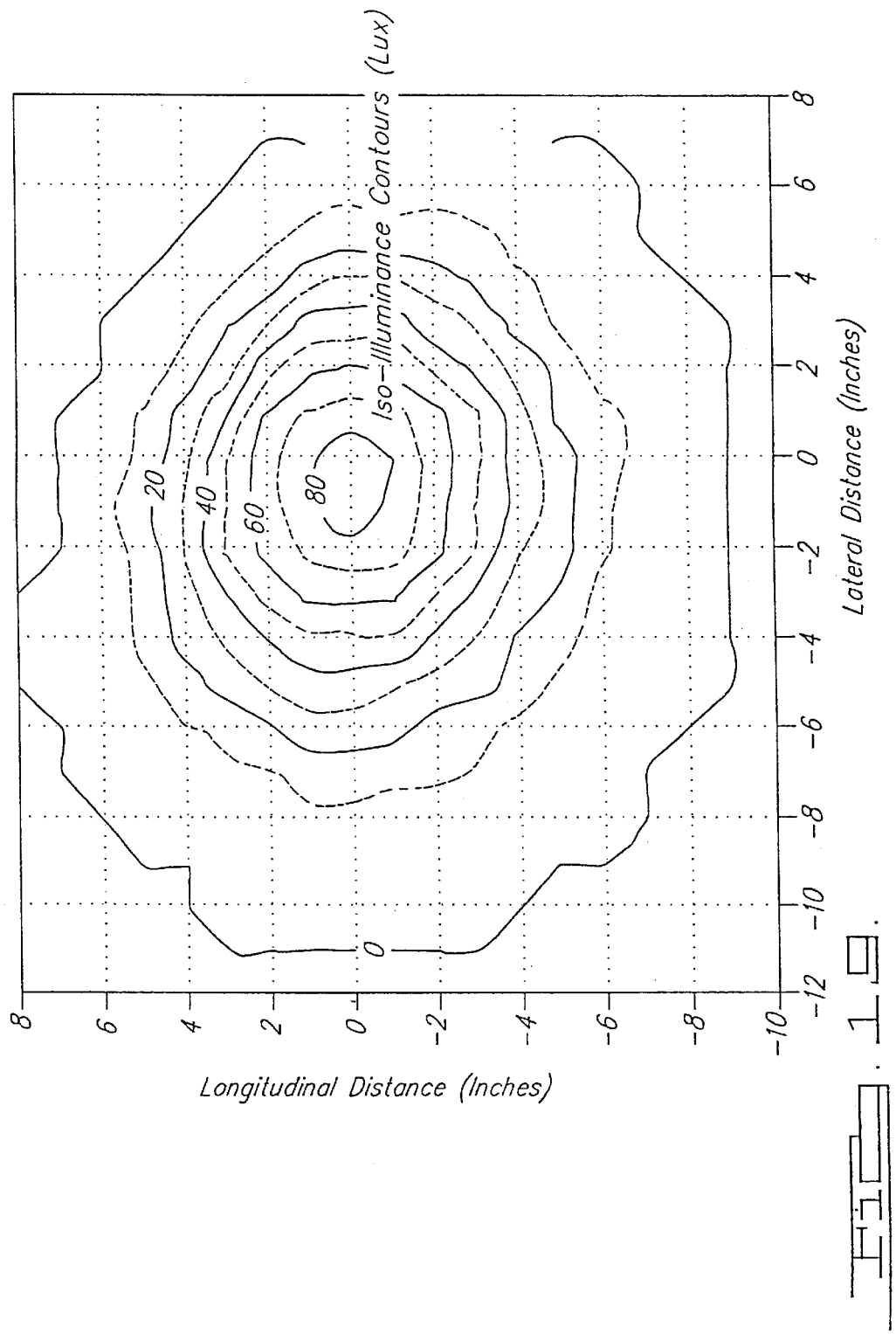
FIG. 19 is an iso-illuminance contour chart plotting the illumination pattern at a target from an illuminator maplight according to the present invention borne by an automotive interior electrochromic mirror.
Figure 20:
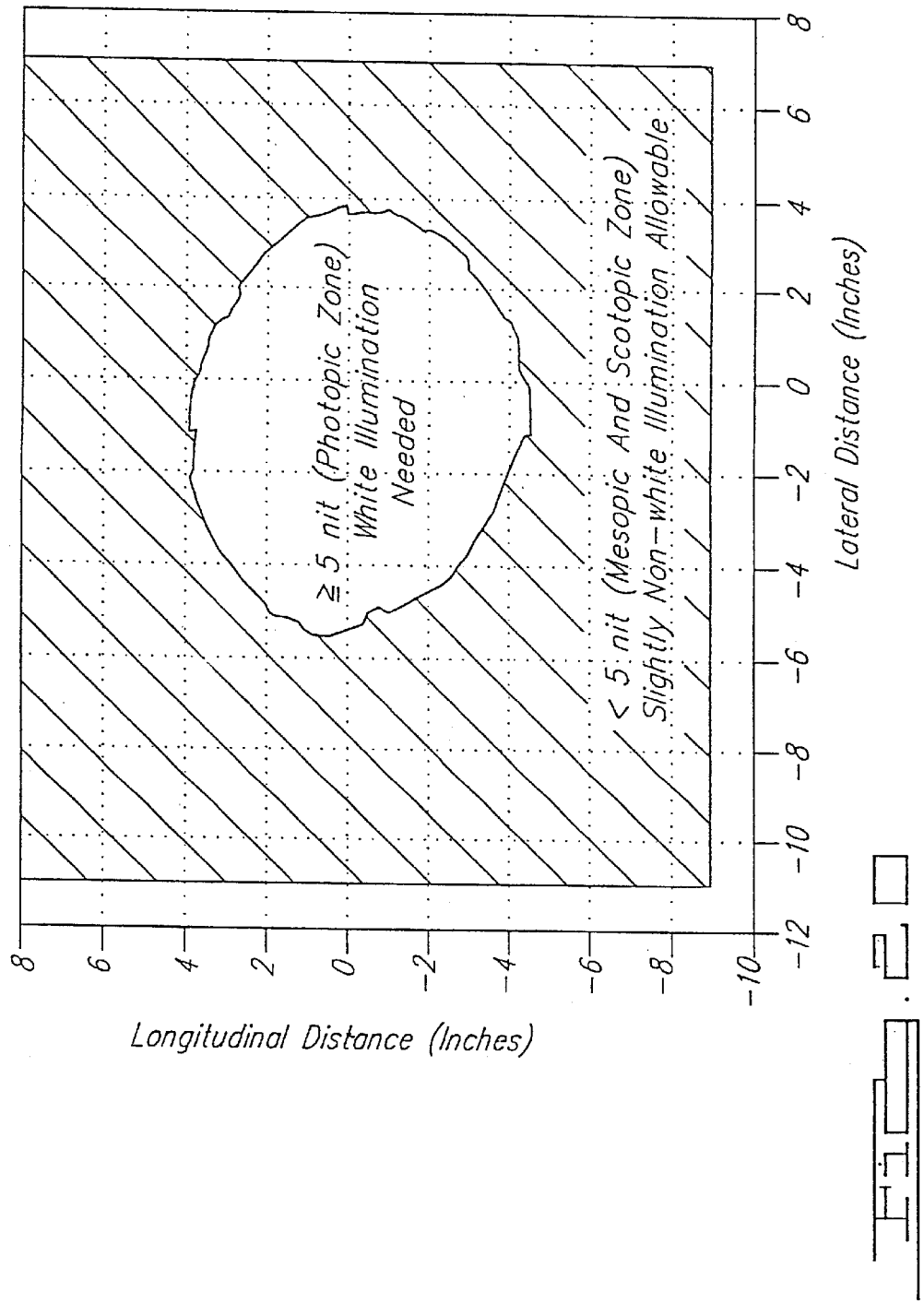
FIG. 20 is a contour map plotting the surface luminance of a 50 percent neutral gray target illuminated by an illuminator maplight according to the present invention borne by an automotive interior rearview mirror.

FIG. 19 shows the measured projected illumination pattern from the illuminator of FIGS. 17 and 18. The data shown were taken with a cosine-corrected illuminance meter from a target whose center distance from the illuminator was 22 inches. The values shown, as for those in FIGS. 17, 18, and 20 represent initial values taken within approximately 30 seconds of initial power-on. A comparison of FIG. 19 and FIG. 15 shows that the illuminator of the present invention meets or exceeds the requirements of an auto manufacturer for an automotive interior mirror map light. Note that the illumination level in the outer target zone which is required to be less than 30 lux by the manufacturer is actually only about 7 lux in the case of the present invention. This is accomplished without compromising the other minimum illuminance requirements (such as in the target center which must be greater than 80 lux) and illustrates the superior directional control achieved in the present invention. This provides a significant safety advantage in that the light which is most distracting to the driver is much less with the LED illuminator of the present invention than with a prior art incandescent light. This advantage is also applicable to vanity mirrors, reading lamps, and dome lights because the illuminator can be directed to where it is wanted and very little illumination goes where it is not wanted. In summary, the LED illuminators of the present invention are more effective at placing light where it is desired and keeping it away from areas where it is undesirable.

FIG. 20 shows a simplified luminance map of a target surface with a hypothetical neutral gray Lambertian reflectance of 50 percent. Note the large area within which Photopic levels of surface luminance are maintained. In the present invention, this zone also coincides with the minimum-sized zone within which the projected illumination possesses a metameric white color as previously defined. Thus, maximum color contrast and luminance contrast are made to coincide in the most critical central portion of the target area, giving observers the best visual discrimination possible.

The inventors have discovered that, outside of this effective Photopic white illumination zone (corresponding to Photopic levels of luminance for a 50 percent neutral gray target), substantial economy may be achieved by allowing the color of the additive mix to stray somewhat from accepted definitions of white. Surprisingly, outside of this zone, the color of the light from the illuminator is not as tangible to the unaided eye. This is apparently because the capability for human vision to perceive colors falls off rapidly as surface luminance falls below the Photopic threshold into Mesopic and Scotopic conditions. Thus, for good color rendering and contrast, a white color should be projected throughout the Photopic illuminance zone and may also be for the surrounding Mesopic illumination zone. However, in order to economize (for instance in order to reduce the overall amount of LED light of a given hue which must be produced and projected in peripheral areas of a target), the illuminator may be allowed to project slightly non-white colors into the surrounding Mesopic illuminance zone.

Although this Photopic threshold is commonly associated with a surface luminance of approximately 5 nit or greater, this can be translated to a corresponding "Photopic illuminance threshold" of approximately 30 lux for Lambertian surfaces with 50 percent neutral gray reflectance factor. A 50 percent neutral gray Lambertian reflector is a suitable reference surface which represents, in a statistical sense, a high percentile of actual objects and surface to be illuminated.

Electronic control 122 energizes, protects, controls, and manages the illumination of the plurality of LEDs 14, 16, and 114 through circuitry. Although those skilled in the art will understand that there are a plethora of electronic circuits which can perform substantially the same function, FIG. 21 illustrates the presently preferred circuit design for an automotive maplight.

Q1 and Q2 form a constant-current source. Q1's base current is supplied by the microprocessor Port 0 through current limiting resistor R2. Q2 regulates Q1's base current to maintain a substantially constant current through R1 and hence the amber LEDs D1–D3. The regulation point is set by the cut-in voltage of Q2's base-emitter junction. A detailed explanation follows.

To energize LEDs D1 through D3, the voltage on Port 0 of the microprocessor U1 must be raised. This causes a current to flow into transistor Q1's base, $I_{b(Q1)}$, to increase. This will cause the collector current of Q1 to increase. Q1's collector current $I_{C(Q1)}$ and the current through D1–D3 from the power supply V1 are substantially the same as the current through R1. This is because Q1's emitter current $I_{E(Q1)}$ is equal to the sum of its collector $I_{C(Q1)}$ and base $I_{B(Q1)}$ currents, and the base current is substantially smaller than the collector current (typically by a factor of 100). This can also be stated in equation form as follows (Equations 9–11).

$$I_{E(Q1)} = I_{C(Q1)} + I_{B(Q1)} \tag{9}$$

$$I_{B(Q1)} << I_{C(Q1)} \tag{10}$$

$$I_{E(Q1)} \approx I_{C(Q1)} \tag{11}$$

As the current through R1 increases, the voltage on Q2's base will increase. Once Q2's base-emitter cut-in voltage $V_{BE(Q2)}$ is reached, Q2's base current $I_{B(Q2)}$ will start to increase exponentially which will in turn cause an increase in Q2's collector current $I_{C(Q2)}$. Q2 will shunt current away from Q1's base, preventing further increases in Q1's collector current. The LED current is set at approximately $V_{BE(Q2)}$/R1 Ampere according to Equation 12.

$$I_{C(Q1)} \approx V_{BE(Q2)}/R1 \quad [12]$$

(approximately 36 mA at 25 degrees Celsius, with VBE= 0.68V and R=19 Ohm). If the current through R1 should decrease for any reason, the voltage across R1 will decrease, reducing Q2's base current and in turn its collector current. This will allow more of the current supplied by the microprocessor U1 through R2 to flow into Q1's base which will increase its collector and emitter currents. This will tend to return the R1 current and hence the current through D1–D3 to its original value.

Because the emitter-base cut-in voltage of a silicon transistor such as Q2 decreases at a rate of approximately 2.5 mV per degree Kelvin ($\Delta V_{BE(Q2)}$), the current through Q1's emitter, collector and D1–D3 will decrease at a rate of approximately ($\Delta V_{BE(Q2)}$/R1) Ampere per degree Kelvin (approximately 132 µA per degree Kelvin in this case).

Q3 and Q4 form another constant-current source. Q3's base current is supplied by the microprocessor Port 1 through current limiting resistor R4. Q4 regulates Q3's base current to maintain a substantially constant current through R3 and hence the blue-green LEDs D4–D5. Operation of this current source is substantially the same as the current source which drives the amber LEDs (D1–D3). In the present design, two current sources are used to accommodate the different maximum current ratings of the blue-green and amber LEDs as well as to allow independent duty cycle control and hence illumination intensity of the two colors. Some applications may allow the use of a single current source or a simple current limiting resistor and/or the series connection of the blue-green and amber LEDs. Multiple current sources may also be required if the forward drop of a series string of the required number of LEDs approaches the supply voltage too closely.

Figure 22:
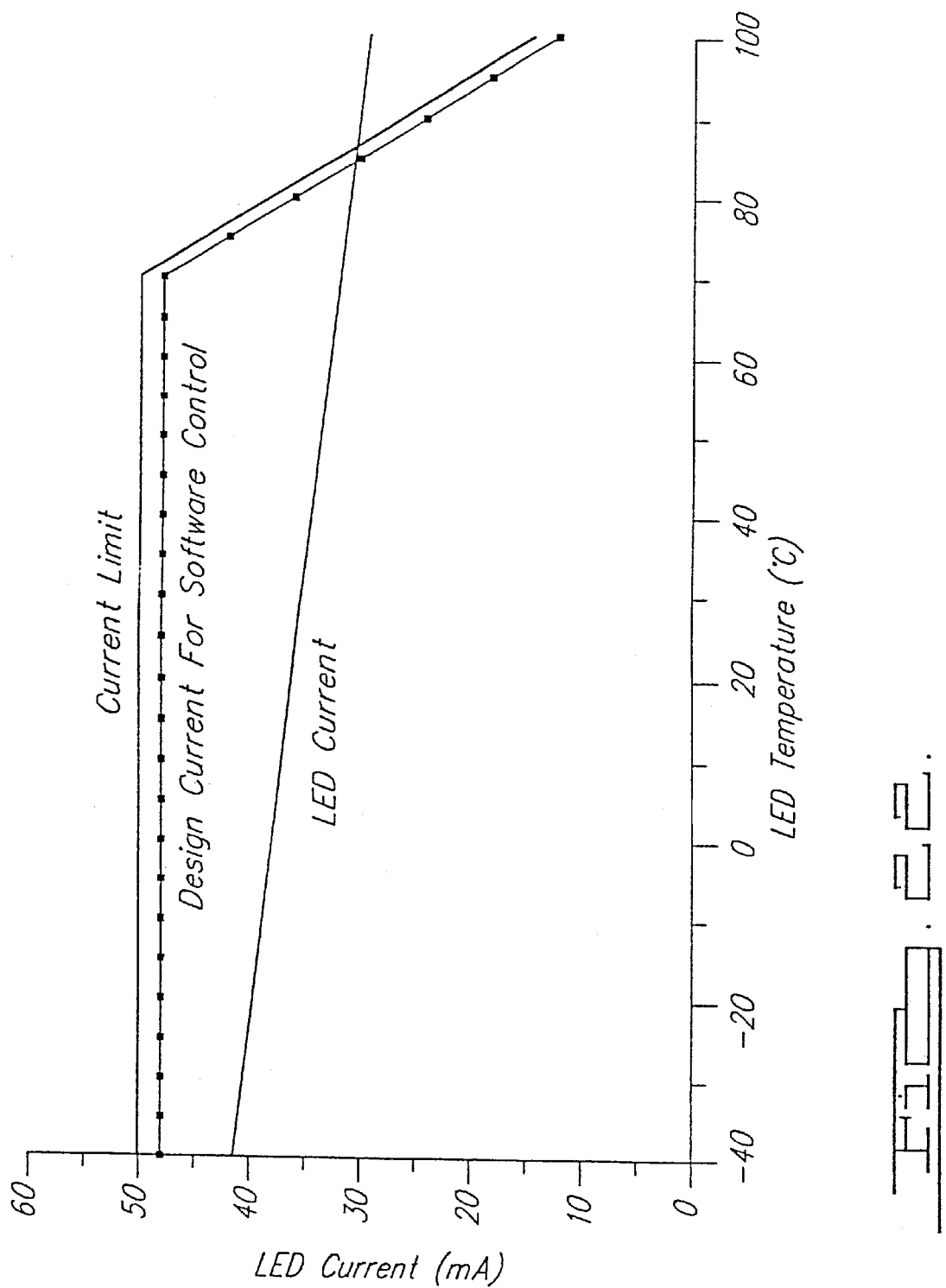
FIG. 22 is a plot of the specified maximum forward current versus temperature for a typical LED and the experimentally determined forward current versus temperature plot for the LEDs of the present invention operated by the circuit of FIG. 21, as well as the design current versus temperature plot for the LEDs of the present invention operated by the circuit of FIG. 21 which also incorporates microprocessor software controls.

This temperature-dependent current drive allows the LEDs to be driven at or very near their maximum forward current during normal (cool) conditions, and as the temperature rises, there is no risk of overloading the LEDs. FIG. 22 shows the specified maximum forward current versus temperature for the preferred amber LEDs as well as the experimentally determined forward current versus temperature plot for the LEDs of the present invention in the above-described circuit. As can be clearly seen, the LEDs can be operated at approximately 42 mA at −40° C., at approximately 36 mA at 25° C. and at 31 mA at 85° C. Thus the LEDs are operated very near their maximum forward current at low temperatures, and the above-described circuitry will automatically adjust the forward current of LEDs D1–D5 to stay within the specification as the temperature rises up to 85° C. Thus, by utilizing the circuitry shown in FIG. 21, the output from the LEDs is maximized during periods of minimum ambient light when the illuminator will predominantly be used (it is typically coolest at nighttime) and decreases during maximum ambient light, i.e., daylight when the illuminator would not generally be used (it is typically hottest during the day). In order to maximize the benefit of the LED illuminator and minimize the cost and complexity required to achieve that benefit, it is very important to operate them at or very near their maximum allowed current rating for the prevailing temperature conditions.

One prior method for avoiding thermal overload of these LEDs when operated at high operating temperatures was to permanently de-rate the LED to run at a non-varying current set at a lower level within that specified for the LED at the maximum specified operating temperature, e.g., 25 mA at 80° C. However, this significantly reduced the luminous output at low temperatures when the LED could be driven harder (and have more output) without damaging the LED, if a more capable circuit was employed.

Another prior method utilized a thermistor in the circuit which measured the ambient temperature and automatically de-rated the LEDs at higher temperatures; however, this complicated the circuit design and, more importantly, substantially increases the cost of the circuit.

The circuit of the present invention is a novel and inexpensive (and therefore commercially viable) method of ensuring that the maximum allowed LED output is achieved at all operating temperatures and achieving nearly a 70 percent increase in luminous output at typical nighttime temperatures as compared to less sophisticated circuits.

LEDs have an operating current of approximately 30–70 mA which is much lower than the typical incandescent lamp operating current of approximately 0.35 amps up to many amps. This lower operating current allows the use of inexpensive bipolar transistors Q1–Q4, such as, for example, MPSA06, for the LED drivers which are much cheaper than the Metal Oxide Semiconductor Field Effect Transistors (MOSFET) required in an electronic control circuit for an incandescent lamp. In addition to decreasing production costs, the bipolar transistors of the present invention automatically de-rate the LEDs as the ambient temperature increases.

As those skilled in the art will realize, the microprocessor U1 can manage and manipulate the output from LEDs D1–D5. For example, by removing any voltage from port 0, the base voltage to Q1 will be zero and no light will be emitted from D1–D3 and only light emitted from D4–D5 will illuminate the interior of the vehicle. Similarly, the voltage from port 1 can be removed and only amber light will illuminate the interior of the vehicle. Of more practical importance is that the emission of either LEDs D1–D3 or D4–D5 can be modulated by the microprocessor U1 by modulating the base currents to Q1 and Q3, respectively. Furthermore, the "amount" of amber light generated from D1–D3 relative to the amount of blue-green light (or other combinations if different LEDs are chosen in accordance with the above metameric teachings) can be varied simply by controlling the modulation of voltage out of ports 0 and 1. Controlling this proportion is especially important in maplights because the properties of the vehicle interior, e.g., colors, dimensions, may warrant a slightly different "white" color emission from the illuminator to maintain maximum readability. By allowing pulse-width modulation, the present circuit design allows for modulation data to be stored in non-volatile memory U2 and easily changed depending on which automobile the mirror assembly will be installed. In addition, time sequential multiplexing allows D1–D3 and D4–D5 to be turned on and off rapidly one after another, such that they are never actually on at the same time. The illumination produced in this fashion is still achromatic and effective because the time constants for human visual response are so slow that the human eye cannot discern the rapidly changing color of the illumination projected by the color-complementary LEDs in the illuminator energized in rapid sequence. In the case of the present LED illuminator, the on/off times can be very fast and the sequencing frequency very high, because LEDs do not suffer from bloom time limitations. Additive mixing occurs and therefore the light from the illuminator in the vehicle looks white, even with a minor time delay between the presence of illumination from the two additive constituents of the mixture.

In addition to manipulating color, the microprocessor U1 can pulse-width modulate the LED currents for purposes of thermal de-rating. A microprocessor U1 with internal or external temperature measurement means can modulate the LED currents to very precisely follow the manufacturers' specified current ratings at each temperature as illustrated by the curve in FIG. 22 labeled "Design Current for Software-Controlled Temperature Compensation." In the case of microprocessor controlled thermal de-rating, the current limiting means must provide a current greater than or equal to the maximum of the design current for software control. For the amber LEDs D1–D3 in the example in FIG. 22, the current limiting means must provide at least 48 mA. This would require changing the value of R1 in FIG. 21 to 14 Ohm. At 70° C., the microprocessor U1 would begin pulse-width modulating the current through D1–D3 in FIG. 21 to reduce the average current to safe levels using a lookup table, calculation or other means to determine the correct duty cycle. Alternatively, R1 in FIG. 21 could be set to 10 Ohm for a 68 mA drive current and the duty cycle set at 70 percent to maintain an average current less than the manufacturer's limit. Obviously, there are an infinite number of current and duty cycle combinations that can be used to maintain the required average current as long as the peak drive current does not exceed the LED manufacturer's peak current ratings.

The invention has been described in detail for a rearview mirror incorporating an illuminator. However, those skilled in the art will realize that the illuminator of the present invention may be used in other vehicular applications such as dome lights, vanity mirror lights, headlamps as well as engine and trunk compartment lights. A dome light assembly or a vanity mirror assembly incorporating an illuminator according to the present invention will have a housing, one or more lenses, and an electronic control in accordance with the above teachings. Any slight modifications to the housing, lenses, and electronic control will be clear to those skilled in the art. In addition to vehicular embodiments, the present invention may be used in non-vehicular embodiments requiring high efficiency, high reliability, long life, low-voltage compact, effective white-light illumination as well without diverting from the present teachings. Such applications include hand-held portable flashlights, head or helmet mounted lamps for mining or mountaineering, task lighting for volatile environments where explosion is a hazard, illuminators mounted in difficult to maintain areas such as atop buildings, automatically activated emergency lighting or back-up lighting in commercial buildings, and microscope stage illuminators to name a few. Again, the minor modifications to the housing, lenses, and electronic control will be clear to those skilled and, therefore, it should be understood that these vehicular and non-vehicular illuminator uses fall within the scope of the present invention.

While the invention has been described in detail herein in accordance with certain preferred embodiments thereof, many modifications and changes therein may be effected by those skilled in the art without materially departing from the novel teachings and advantages of this invention. Accordingly, all such modifications are intended to be included within the scope of this invention as defined in the following claims and, therefore, it is our intent to be limited only by the scope of the appending claims and not by way of the details and instrumentalities describing the embodiments shown herein. In the claims, means-plus-function clauses are intended to cover the structures described herein as performing equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A multichip LED comprising at least two LED chips contained in a single enclosure, said at least two LED chips including a first LED chip and a second LED chip, where said second LED chip emits illumation having a different hue than that emitted by said first LED chip, wherein when both said first and second LED chips are proportionately energized, illumination projected from said first and second LED chips overlaps and forms effective white illumination.

2. The multichip LED of claim 1, wherein said enclosure is made of a polymer matrix.

3. The multichip LED of claim 1, wherein said enclosure is configured to function as a lens.

4. The multichip LED of claim 1, wherein neither of said first and second LED chips projects illumination having a green hue.

5. The multichip LED of claim 1, wherein neither of said first and second LED chips projects illumination having a red hue.

6. The multichip LED of claim 1, wherein the illumination projected from each of said first and second LED chips has a peak wavelength of less than 635 nm.

7. The multichip LED of claim 1, wherein the illumination projected from each of said first and second LED chips has a dominant wavelength below 635 nm.

8. The multichip LED of claim 1, wherein the illumination projected from said first LED chip has a blue-green hue and the illumination projected from said second LED chip has an amber hue.

9. The multichip LED of claim 1, wherein the illumination projected from neither of said first and second LED chips has a dominant wavelength between 505 and 530 nm.

10. The multichip LED of claim 1, wherein said overlapped and mixed effective illumination has an illuminance at some predetermined distance from said first and second LED chips greater than about 15 lux.

11. The multichip LED of claim 10, wherein said predetermined distance is greater than about 10 times the distance separating said first LED chip from said second LED chip.

12. The multichip LED of claim 1, wherein said multichip LED is incorporated in a vehicular illuminator assembly.

13. The multichip LED of claim 1, wherein said first LED chip and said second LED chip are independently energized.

14. The multichip LED of claim 13, wherein said first LED chip and said second LED chip are electrically connected in parallel.

15. The multichip LED of claim 1, wherein said first LED chip and said second LED chip are electrically connected in series.

16. A multichip LED comprising:
   a substrate;
   a first LED chip mounted on said substrate;
   a second LED chip mounted on said substrate for emitting light having a different hue than that emitted by said first LED chip; and
   a polymer matrix enclosure for encapsulating said first and second LED chips on said substrate,
   wherein when said first and second LED chips are energized, light projected from said first and second LED chips overlaps and is capable of forming effective white light.

17. The multichip LED of claim 16, wherein said enclosure is configured to function as a lens.

18. The multichip LED of claim 16, wherein neither of said first and second LED chips projects light having a blue hue.

19. The multichip LED of claim 16, wherein neither of said first and second LED chips projects light having a green hue.

20. The multichip LED of claim 16, wherein neither of said first and second LED chips projects light having a red hue.

21. The multichip LED of claim 16, wherein the light projected from each of said first and second LED chips has a peak wavelength of less than 635 nm.

22. The multichip LED of claim 16, wherein the light projected from each of said first and second LED chips has a dominant wavelength below 635 nm.

23. The multichip LED of claim 16, wherein the light projected from said first LED chip has a blue-green hue and the illumination projected from said second LED chip has an amber hue.

24. The multichip LED of claim 16, wherein the light projected from neither of said first and second LED chips has a dominant wavelength between 505 and 530 nm.

25. The multichip LED of claim 16, wherein said overlapped and mixed effective light has an illuminance at some predetermined distance from said polymer matrix enclosure greater than about 15 lux.

26. The multichip LED of claim 25, wherein said predetermined distance is greater than about 10 times the distance separating said first LED chip from said second LED chip.

27. The multichip LED of claim 16, wherein said multichip LED is incorporated in a vehicular illuminator assembly.

28. The multichip LED of claim 16, wherein said first LED chip and said second LED chip are independently energized.

29. A lighting device comprising a multichip LED having at least two LED chips contained in a single enclosure, said at least two LED chips including a first LED chip and a second LED chip, where the second LED chip emits light having a different hue than that emitted by said first LED chip, wherein when both said first and second LED chips are proportionately energized, light projected from said first and second LEDs overlaps and forms effective white light.

30. The lighting device of claim 29 and further including a control circuit for varying the intensity of the light generated by at least one of said LED chips, wherein said first and second LED chips are oriented such that the light projected from each of said first and second LED chip overlaps and is capable of forming effective white light.

31. The lighting device of claim 30, wherein said control circuit enables the intensity of the light generated by both said first and second LED chips to be adjusted so as to change the illuminance of the effective white light.

32. The lighting device of claim 30, wherein said control circuit enables the intensity of the light generated by either or both of said first and second LED chips to be independently adjusted to thereby change the perceived color of the light emitted from the lighting device.

33. The lighting device of claim 29, wherein said lighting device is a vehicle indicator light mounted to a vehicle.

34. The lighting device of claim 33, wherein the light projected from said first LED chip has an amber hue and is activated independently of said second LED chip.

35. The lighting device of claim 29, wherein said lighting device is an indicator light.

36. The lighting device of claim 29, wherein said lighting device is an illumination light.

37. The lighting device of claim 36, wherein said illumination light is a vehicle illumination light mounted to a vehicle.

38. The lighting device of claim 37 and further including a vehicular support member for mounting said multichip LED to a vehicle.

39. The lighting device of claim 38, wherein said illumination light illuminates a portion of the interior of a vehicle.

40. The lighting device of claim 38, wherein said illumination light illuminates a portion of the area on and/or surrounding the exterior of a vehicle.

41. The lighting device of claim 38, where said vehicular support member is a component of an interior rearview mirror.

42. The lighting device of claim 38, where said vehicular support member is a component of an exterior rearview mirror.

43. The lighting device of claim 38, where said vehicular support member is a component of a dome light.

44. The lighting device of claim 38, where said vehicular support member is a component of a vanity light.

45. The lighting device of claim 38 and further including a control circuit for varying the intensity of the light generated by either or both of at least one of said first and second LED chips, said first and second LED chips being independently adjustable to thereby change the perceived color of the illumination emitted from the lighting device, wherein said first and second LED chips are oriented such that the light projected from each LED chip overlaps and is capable of forming effective white light.

46. The lighting device of claim 29, wherein said multichip LED further includes a third LED that, when energized, projects light exhibiting color coordinates different from the light projected from either of said first or second LED chips.

47. The lighting device of claim 46 and further including a control circuit for varying the intensity of the light generated by either or all of said first, second and third LED chips being independently adjustable to thereby change the perceived color of the light emitted from the lighting device, wherein said first, second and third LED chips are oriented such that the light projected from each LED chip overlaps and is capable of forming effective white light.

48. The lighting device of claim 29, wherein said lighting device is an illuminator for a display panel.

49. The lighting device of claim 29, wherein said lighting device is an illuminator for a vehicle instrument panel.

50. The lighting device of claim 29, wherein said lighting device is a backlight illuminator for a display indicia.

51. A multichip white-light-emitting discrete LED device comprising:
   a lead frame;
   at least two LED chips mounted on said lead frame; and
   a polymer encapsulant for encapsulating said LED chips on said lead frame,
   wherein when energized, said at least two LED chips emit light having two different and complementary spectral bands that together form white light.

52. A multichip white-light-emitting discrete LED device comprising:
   a lead frame;
   at least three LED chips mounted on said lead frame; and
   a polymer encapsulant for encapsulating said LED chips on said lead frame,
   wherein when energized, said LED chips emit light having three different and complementary spectral bands that combine to form white light, wherein none of the spectral bands have a peak wavelength greater than 635 mn, and where said LED device is capable of projecting effective white illumination of greater than about 15 lux at a predetermined distance of 10 times the distance between any two of said LED chips when the LED chips are proportionately energized.

53. The lighting device of claim 33, wherein the light projected from said first LED chip has a red or red-orange hue and is activated independently of said second LED chip.

54. A multichip white-light-emitting LED device comprising:
a substrate;
at least two LED chips mounted on said substrate; and
a polymer encapsulant for covering said LED chips on said substrate,
wherein, when energized, said at least two LED chips emit light having two different and complementary spectral bands that together form white light.

55. The LED device of claim 54, wherein said substrate is a printed circuit board.

56. A multichip white-light-emitting LED device comprising:
a substrate;
at least three LED chips mounted to said substrate; and
a polymer encapsulant for covering said LED chips on said substrate,
wherein when energized, the LED chips emit light having three different and complementary spectral bands that combine to form white light, wherein said LED device is capable of projecting effective white illumination of greater than about 15 lux at a predetermined distance of 10 times the distance between two or more of said LED chips when the LED chips are proportionately energized, and wherein none of the spectral bands has a peak wavelength great man 635 nm.

57. A multichip white-light-emitting LED device comprising:
a support structure;
at least three LED chips mounted to said support structure; and
a polymer encapsulant for covering said LED chips on said support structure, wherein the light exiting said encapsulant has three different and complementary spectral bands that combine to form white light, and wherein none of the spectral bands correspond to red light.

58. A multichip white-light-emitting LED device comprising:
a support structure;
at least three LED chips mounted to said support structure; and
a polymer encapsulant for covering said LED chips on said support structure, wherein the light exiting said encapsulant has three different and complementary spectral bands that combine to form white light, and wherein none of the spectral bands correspond to blue light.

59. A multichip white-light-emitting LED device comprising:
a support structure;
at least three LED chips mounted to said support structure; and
a polymer encapsulant for covering said LED chips on said support structure, wherein the light exiting said encapsulant has three different and complementary spectral bands that combine to form white light, and wherein none of the spectral bands correspond to green light.

60. The multichip white-light-emitting LED device of claim 57, wherein said support structure is a lead frame.

61. The multichip white-light-emitting LED device of claim 57, wherein said support structure is a substrate.

62. The multichip LED of claim 1, wherein said LED chips project illumination in response to current from a DC source.

63. The multichip LED of claim 1, wherein said LED chips project illumination in response to voltages less than about 13 volts.

64. The multichip LED of claim 1, wherein one of said first and second LEDs emits illumination having a peak wavelength of at least about 584 nm.

65. The multichip LED of claim 1, wherein one of said first and second LEDs emits illumination having a peak wavelength of less than about 530 nm.

66. The multichip LED of claim 1, wherein one of said first and second LEDs is made in part of a material selected from the group consisting of AlInGaP and AlGaAs.

67. The multichip LED of claim 1, wherein one of said first and second LEDs is made in part of a material including GaN.

68. The multichip LED of claim 16, wherein neither of said first and second LED chips projects light having a yellow hue.

69. A light emitting assembly comprising:
a support structure;
a first light source carried on said support structure, wherein said first light source is an LED; and
a second light source carried on said support structure, wherein said second light source is an LED,
said first and second light sources oriented such that when said first and second light sources emit light, light emitted from said first and second light sources overlaps and is capable of forming effective white light, the light emitted from each of said first and second light sources having a peak wavelength of less than 635 nm, wherein the light emitted from said first light source exhibits color coordinates different from the light emitted from said second source.

70. The light emitting assembly of claim 69, wherein one of said LEDs emits blue-green light.

71. The light emitting assembly of claim 69, wherein said support structure is a leadframe.

72. A light emitting assembly comprising first and second light sources oriented such that when said first and second light sources emit light, light emitted from said first and second light sources overlaps and is capable of forming effective white light, the light emitted from each of said first and second light sources having a peak wavelength below 635 nm, wherein the light emitted from said first light source exhibits color coordinates different from the light emitted from said second light source, wherein said first and second light sources are LEDs.

73. The light emitting assembly of claim 72, wherein one of said LED emits blue-green light.

74. A light emitting assembly comprising first and second light sources oriented such that when said first and second light sources emit light, light emitted from said first and second light sources overlaps and is capable of forming effective white light, wherein neither of said first and second light sources emits light having a red hue, and wherein the light emitted from said first light source exhibits color coordinates different from the light emitted from said second light source, wherein said first and second light sources are LEDs.

75. The light emitting assembly of claim 74, where said first light source emits blue-green light.

76. The light emitting assembly of claim 74, wherein said assembly is a license plate illuminator for a vehicle and said assembly further comprises a mechanism for mounting said light sources to the vehicle such that the white light emitted from said assembly is projected onto the license plate.

77. A license plate illuminator for a vehicle comprising:
first and second light sources oriented such that when said first and second light sources emit light, light emitted from said first and second light sources overlaps and is capable of forming effective white light, and wherein the light emitted from said first light source exhibits color coordinates different from the light emitted from said second light source, wherein said first and second light sources are LEDs; and
a mechanism for mounting said light sources to the vehicle such that the white light fitted from said light sources is projected onto the license plate.

78. The license plate illuminator of claim 77, wherein neither of said first and second light sources emits light having a red hue.

79. The license plate illuminator of claim 77, wherein neither of said first and second light sources emits light having a green hue.

80. The license plate illuminator of claim 77, wherein neither of said first and second light sources emits light having a blue hue.

81. The license plate illuminator of claim 77, wherein said first light source includes an LED that emits light having a blue-green hue.

82. The license plate illuminator of claim 77, wherein said first and second light sources are embodied in a single discrete LED component including a leadframe; at least two LED chips disposed on said leadframe; and an encapsulant encapsulating said at least two LED chips on said leadframe.

83. A license plate illuminator for a vehicle comprising:
at least one discrete LED component comprising:
a first light source including an LED chip,
a second light source including an LED chip,
a leadframe, wherein said LED chips are disposed on said leadframe, and
an encapsulant for protecting said LED chips and portions of said leadframe, wherein the light emitted from said first light source exhibits color coordinates different from the light emitted from said second light source, and wherein light emitted from said first and second light sources overlaps and is capable of forming effective white light; and
a mechanism for mounting said discrete LED component to the vehicle such that the white light emitted from said discrete LED component is projected onto the license plate.

84. The license plate illuminator of claim 83, wherein neither of said first and second light sources emits light having a red hue.

* * * * *

UNITED STATES PATENT AND TRADEMARK OFFICE
CERTIFICATE OF CORRECTION

PATENT NO. : 6,523,976 B1
DATED : February 25, 2003
INVENTOR(S) : Turnbull et al.

It is certified that error appears in the above-identified patent and that said Letters Patent is hereby corrected as shown below:

<u>Title page, Item [54] and Column 1, line 1,</u>
Title, "LED ASSEMBLY" should be -- WHITE LIGHT-EMITTING DISCRETE LED COMPONENT, LED ASSEMBLY, AND LICENSE PLATE ILLUMINATOR --.

<u>Column 13,</u>
Line 21, after "such" insert -- as --.
Line 22, delete "is".

<u>Column 18,</u>
Line 27, delete "is".

<u>Column 21,</u>
Line 1, after "635" insert -- nm --.

<u>Column 32,</u>
Line 14, "increases" should be -- increased --.

<u>Column 35,</u>
Line 50, "chip" should be -- chips --.

<u>Column 37,</u>
Line 37, "great man" should be -- greater than --.

<u>Column 38,</u>
Line 60, "LED" should be -- LEDs --.

UNITED STATES PATENT AND TRADEMARK OFFICE
CERTIFICATE OF CORRECTION

PATENT NO. : 6,523,976 B1
DATED : February 25, 2003
INVENTOR(S) : Turnbull et al.

It is certified that error appears in the above-identified patent and that said Letters Patent is hereby corrected as shown below:

Column 39,
Line 21, "fitted" should be -- emitted --.

Signed and Sealed this

Eighteenth Day of November, 2003

JAMES E. ROGAN
*Director of the United States Patent and Trademark Office*